(12) United States Patent
Park et al.

(10) Patent No.: US 10,192,881 B2
(45) Date of Patent: Jan. 29, 2019

(54) SEMICONDUCTOR DEVICE

(71) Applicants: Sang Wuk Park, Hwaseong-si (KR);
Hyuk Kim, Seongnam-si (KR);
Kyoung Sub Shin, Seongnam-si (KR);
Gang Zhang, Suwon-si (KR)

(72) Inventors: Sang Wuk Park, Hwaseong-si (KR);
Hyuk Kim, Seongnam-si (KR);
Kyoung Sub Shin, Seongnam-si (KR);
Gang Zhang, Suwon-si (KR)

(73) Assignee: Samsung Electronics Co., Ltd. (KR)

(*) Notice: Subject to any disclaimer, the term of this patent is extended or adjusted under 35 U.S.C. 154(b) by 0 days.

(21) Appl. No.: 14/841,328

(22) Filed: Aug. 31, 2015

(65) Prior Publication Data

US 2016/0071855 A1 Mar. 10, 2016

(30) Foreign Application Priority Data

Sep. 5, 2014 (KR) .................. 10-2014-0119294

(51) Int. Cl.
*H01L 27/1157* (2017.01)
*H01L 27/11524* (2017.01)
*H01L 27/11556* (2017.01)
*H01L 27/11582* (2017.01)

(52) U.S. Cl.
CPC .... *H01L 27/11582* (2013.01); *H01L 27/1157* (2013.01); *H01L 27/11524* (2013.01); *H01L 27/11556* (2013.01)

(58) Field of Classification Search
CPC .......... H01L 27/11582; H01L 27/1157; H01L 27/11556; H01L 27/11524
See application file for complete search history.

(56) References Cited

U.S. PATENT DOCUMENTS

| 7,679,133 | B2 | 3/2010 | Son et al. |
| 8,274,108 | B2 | 9/2012 | Katsumata et al. |
| 8,338,882 | B2 | 12/2012 | Tanaka et al. |
| 8,426,908 | B2 | 4/2013 | Higashi |
| 8,541,831 | B2 | 9/2013 | Chae et al. |
| 8,547,720 | B2 | 10/2013 | Samachisa et al. |
| 8,553,466 | B2 | 10/2013 | Han et al. |
| 8,559,235 | B2 | 10/2013 | Yoon et al. |
| 8,654,587 | B2 | 2/2014 | Yoon et al. |
| 2011/0233648 | A1* | 9/2011 | Seol ............ H01L 21/32137 257/324 |
| 2012/0280299 | A1 | 11/2012 | Yun et al. |
| 2014/0063890 | A1 | 3/2014 | Lee et al. |

FOREIGN PATENT DOCUMENTS

| KR | 1020090123477 A | 12/2009 |
| KR | 1020110015337 A | 2/2011 |
| KR | 1020130080983 A | 7/2013 |

* cited by examiner

Primary Examiner — Amar Movva
(74) Attorney, Agent, or Firm — Myers Bigel, P.A.

(57) ABSTRACT

A semiconductor device includes gate stacks disposed on a substrate and spaced apart from each other in a first direction, with a separation region interposed between the gate stacks; channel regions penetrating through the gate stacks and disposed within each of the gate stacks; and a guide region adjacent to the separation region, penetrating through at least a portion of the gate stack, and having a bent portion that is bent toward the separation region.

16 Claims, 27 Drawing Sheets

US 10,192,881 B2

SEMICONDUCTOR DEVICE

CROSS-REFERENCE TO RELATED APPLICATION

This application claims the priority and benefit of Korean Patent Application No. 10-2014-0119294 filed on Sep. 5, 2014, with the Korean Intellectual Property Office, the disclosure of which is incorporated herein by reference.

BACKGROUND

The present inventive concept relates to semiconductor devices.

Market demand exists for electronic products able to process large amounts of data, while volumes thereof have gradually been reduced. Accordingly, degrees of integration of semiconductor devices used in such electronic products may need to be increased. As an approach to increasing the degree of integration of semiconductor devices, a semiconductor device having a vertical transistor structure instead of an existing planar transistor structure has been considered.

SUMMARY

An aspect of the present inventive concept may provide a semiconductor device having improved reliability.

According to an aspect of the present inventive concept, a semiconductor device may include: gate stacks disposed on a substrate and spaced apart from each other in a first direction, with a separation region interposed between the gate stacks; channel regions penetrating through the gate stacks and disposed within each of the gate stacks; and a guide region adjacent to the separation region, penetrating through at least a portion of the gate stack, and having a bent portion that is bent toward the separation region.

The guide region may be extended from an upper portion of the gate stack to the substrate, and the bent portion may be positioned in a lower portion of the guide region adjacent to the substrate.

The guide region may include a plurality of guide regions arranged regularly with the channel regions.

The channel regions may be disposed in a plurality of rows within each of the gate stacks, and the guide region may be positioned outwardly of the channel regions disposed in the plurality of rows.

The guide region may include a plurality of guide regions disposed in at least one row in a second direction perpendicular with respect to the first direction.

The guide region may be disposed within each of the gate stacks and be surrounded by the gate stack.

At least a portion of the guide region may be exposed through the separation region.

The bent portion may be exposed through the separation region.

A depth of the guide region may be shallower than that of the channel regions, from an upper surface of the separation region relative to the substrate.

The guide region may not be connected to the substrate.

The guide region may have a size identical to or smaller than that of each of the channel regions on a plane parallel to an upper surface of the substrate.

The channel regions and the guide region may include channel layers and at least portions of gate dielectric layers and have pillar shapes.

The semiconductor device may further include bit lines electrically connected to the channel layers within the channel regions, wherein the channel layer of the guide region may be electrically isolated from the bit lines.

The gate stacks may include gate electrodes disposed on the substrate and spaced apart from each other in a vertical direction and interlayer insulating layers alternately stacked with the gate electrodes.

According to another aspect of the present inventive concept, a semiconductor device may include: channel regions disposed in a plurality of rows and including channel layers; and a guide region disposed outwardly of the channel regions disposed in the plurality of rows and having a bent portion bent in a direction away from the channel regions.

Other methods, systems, and/or devices according to embodiments of the inventive subject matter will be or become apparent to one with skill in the art upon review of the following drawings and detailed description. It is intended that all such additional methods, systems, and/or devices be included within this description, be within the scope of the present inventive concepts, and be protected by the accompanying claims. Moreover, it is intended that all embodiments disclosed herein can be implemented separately or combined in any way and/or combination.

BRIEF DESCRIPTION OF DRAWINGS

The above and other aspects, features and other advantages of the present inventive concept will be more clearly understood from the following detailed description taken in conjunction with the accompanying drawings, in which.

DETAILED DESCRIPTION

Figure 1:
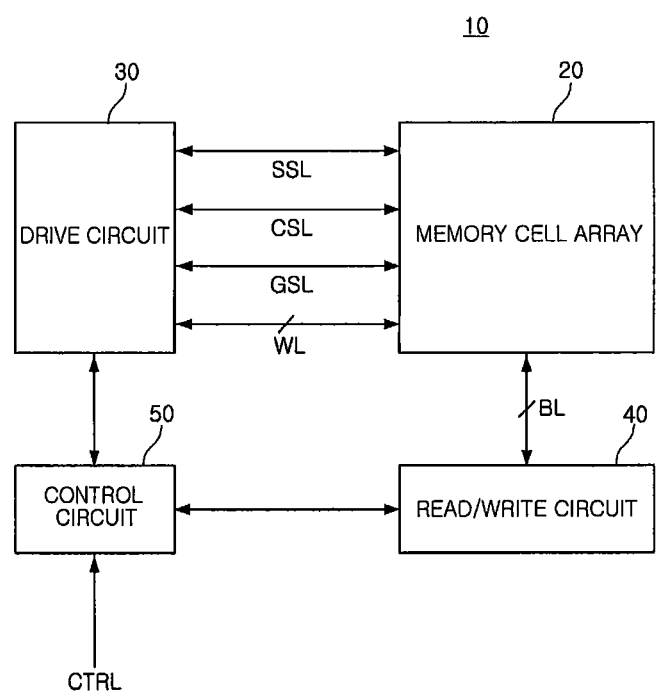
FIG. 1 is a schematic block diagram of a semiconductor device according to an example embodiment of the present inventive concept.

Example embodiments of the inventive concepts will now be described more fully with reference to the accompanying drawings, in which example embodiments are shown. Example embodiments of the inventive concepts may, however, be embodied in many different forms and should not be construed as being limited to the embodiments set forth herein; rather, these embodiments are provided so that this disclosure will be thorough and complete, and will fully convey the concept of example embodiments to those of ordinary skill in the art. In the drawings, the thicknesses of layers and regions are exaggerated for clarity. Like reference numerals in the drawings denote like elements, and thus their description will be omitted.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Like numbers indicate like elements throughout. As used herein the term "and/or" includes any and all combinations of one or more of the associated listed items. Other words used to describe the relationship between elements or layers should be interpreted in a like fashion (e.g., "between" versus "directly between," "adjacent" versus "directly adjacent," "on" versus "directly on").

It will be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises", "comprising", "includes" and/or "including," if used herein, specify the presence of stated features, integers, steps, operations, elements and/or components, but do not preclude the presence or addition of one or more other features, integers, steps, operations, elements, components and/or groups thereof.

Example embodiments of the inventive concepts are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments of the inventive concepts should not be construed as limited to the particular shapes of regions illustrated herein but are to include deviations in shapes that result, for example, from manufacturing. For example, an implanted region illustrated as a rectangle may have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of example embodiments.

Unless otherwise defined, all terms (including technical and scientific terms) used herein have the same meaning as commonly understood by one of ordinary skill in the art to which example embodiments of the inventive concepts belong. It will be further understood that terms, such as those defined in commonly-used dictionaries, should be interpreted as having a meaning that is consistent with their meaning in the context of the relevant art and this specification and will not be interpreted in an idealized or overly formal sense unless expressly so defined herein.

In an embodiment of the present inventive concept, a three dimensional (3D) memory array is provided. The 3D memory array is monolithically formed in one or more physical levels of arrays of memory cells having an active area disposed above a silicon substrate and circuitry associated with the operation of those memory cells, whether such associated circuitry is above or within such substrate. The term "monolithic" means that layers of each level of the array are directly deposited on the layers of each underlying level of the array.

As appreciated by the present inventive entity, devices and methods of forming devices according to various embodiments described herein may be embodied in microelectronic devices such as integrated circuits, wherein a plurality of devices according to various embodiments described herein are integrated in the same microelectronic device. Accordingly, the cross-sectional view(s) illustrated herein may be replicated in two different directions, which need not be orthogonal, in the microelectronic device. Thus, a plan view of the microelectronic device that embodies devices according to various embodiments described herein may include a plurality of the devices in an array and/or in a two-dimensional pattern that is based on the functionality of the microelectronic device.

The devices according to various embodiments described herein may be interspersed among other devices depending on the functionality of the microelectronic device. Moreover, microelectronic devices according to various embodiments described herein may be replicated in a third direction that may be orthogonal to the two different directions, to provide three-dimensional integrated circuits.

Accordingly, the cross-sectional view(s) illustrated herein provide support for a plurality of devices according to various embodiments described herein that extend along two different directions in a plan view and/or in three different directions in a perspective view. For example, when a single active region is illustrated in a cross-sectional view of a device/structure, the device/structure may include a plurality of active regions and device structures thereon, as would be illustrated by a plan view of the device/structure.

The following patent documents, which are hereby incorporated by reference, describe example configurations for three-dimensional memory arrays, in which the three-dimensional memory array is configured as a plurality of levels, with word lines and/or bit lines shared between levels: U.S. Pat. Nos. 7,679,133; 8,553,466; 8,654,587; 8,559,235; and US Pat. Pub. No. 2011/0233648.

FIG. 1 is a schematic block diagram of a semiconductor device according to an example embodiment of the present inventive concept.

Referring to FIG. 1, a semiconductor device 10 according to an example embodiment of the present inventive concept may include a memory cell array 20, a drive circuit 30, a read/write circuit 40, and a control circuit 50.

The memory cell array 20 may include a plurality of memory cells, and the plurality of memory cells may be arranged in a plurality of rows and columns. The plurality of memory cells of the memory cell array 20 may be connected to the drive circuit 30 through word lines WL, common source lines CSL, string select lines SSL, ground select lines GSL, and the like and may be connected to the read/write circuit 40 through bit lines BL. In an example embodiment of the present inventive concept, a plurality of memory cells arranged in the same row may be connected to the same word line WL, and a plurality of memory cells arranged in the same column may be connected the same bit line BL.

The plurality of memory cells of the memory cell array 20 may be classified into a plurality of memory blocks. Each memory block may include a plurality of word lines WL, a plurality of string select lines SSL, a plurality of ground select lines GSL, a plurality of bit lines BL, and at least one common source line CSL.

The drive circuit 30 and the read/write circuit 40 may be operated by the control circuit 50. By way of example, the drive circuit 30 may receive address information from the control circuit 50 and decode the received address information to select at least a portion of the word lines WL, the common source lines CSL, the string select lines SSL, and the ground select lines GSL. The drive circuit 30 may include drive circuit units for the respective word lines WL, the string select lines SSL, and the common source lines CSL.

The read/write circuit 40 may select at least a portion of the bit lines BL connected to the memory cell array 20 in response to a command received from the control circuit 50. The read/write circuit 40 may read data stored in the memory cell connected to the at least a portion of the bit lines BL or write data in the memory cell connected to the at least a portion of the bit lines BL. The read/write circuit 40 may include circuits, such as a page buffer, an input/output buffer, a data latch, and the like, to perform the operations as described above.

The control circuit 50 may control operations of the drive circuit 30 and the read/write circuit 40 in response to a control signal CTRL transferred from an external source. In the case that data stored in the memory cell array 20 is read, the control circuit 50 may control an operation of the drive circuit 30 to supply a reading operation voltage to the word line WL in which data to be read is stored. When the reading operation voltage is supplied to a certain word line WL, the control circuit 50 may control the read/write circuit 40 to read data stored in the memory cell connected to the word line WL to which the reading operation voltage is supplied.

In the case that data is written to the memory cell array 20, the control circuit 50 may control an operation of the drive circuit 30 to supply a writing operation voltage to the word line WL in which data is to be written. When the writing operation voltage is supplied to the certain word line WL, the control circuit 50 may control the read/write circuit 40 to write data to the memory cell connected to the word line WL to which the writing operation voltage is supplied.

Figure 2:
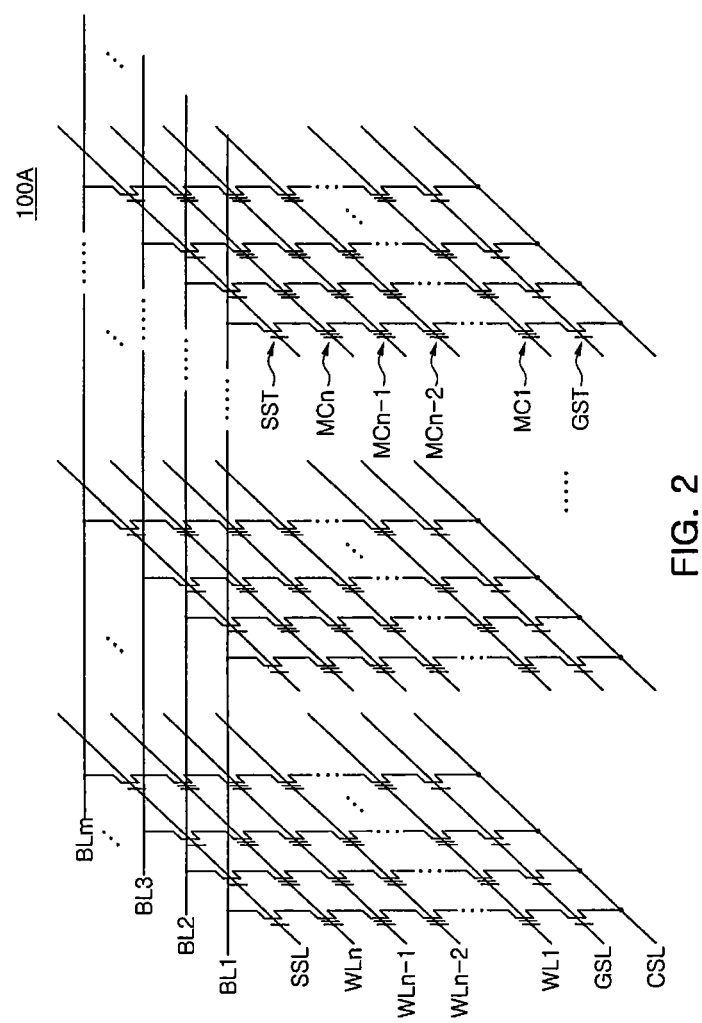
FIG. 2 is an equivalent circuit diagram of a memory cell array in a semiconductor device according to an example embodiment of the present inventive concept.

FIG. 2 is an equivalent circuit diagram of a memory cell array in a semiconductor device according to an example embodiment of the present inventive concept.

FIG. 2 is an equivalent circuit diagram illustrating a three-dimensional structure of a memory cell array included in a semiconductor device 100A having a vertical structure. Referring to FIG. 2, the memory cell array according to the example embodiment may include a plurality of memory cell strings including n-number of memory cells MC1 to MCn connected in series, and a ground select transistor GST and a string select transistor SST connected in series to both terminals of the memory cells MC1 to MCn.

The n-number of memory cells MC1 to MCn connected in series may be connected to the word lines WL1 to WLn to select at least a portion of the memory cells MC1 to MCn, respectively.

A gate terminal of the ground select transistor GST may be connected to the ground select line GSL and a source terminal thereof may be connected to the common source line CSL. Meanwhile, a gate terminal of the string select transistor SST may be connected to the string select line SSL and a source thereof may be connected to a drain terminal of the memory cell MCn. FIG. 2 illustrates a structure in which a single ground select transistor GST and a single string select transistor SST are connected to the n-number of memory cells MC1 to MCn connected in series. However, in another embodiment, a plurality of ground select transistors GST or a plurality of string select transistors SST may be connected to the n-number of memory cells MC1 to MCn connected in series.

A drain terminal of the string select transistor SST may be connected to bit lines BL1 to BLm. When a signal is applied to the gate terminal of the string select transistor SST through the string select line SSL, a signal applied through the bit lines BL1 to BLm may be transferred to the n-number of memory cells MC1 to MCn connected in series, whereby a data reading or writing operation may be performed. Further, in the case that a signal is applied to a gate terminal of a gate select transistor GST having a source terminal thereof connected to the common source line CSL, through a gate select line GSL, an erase operation of removing all charges stored in the n-number of memory cells MC1 to MCn may be carried-out.

Figure 3:
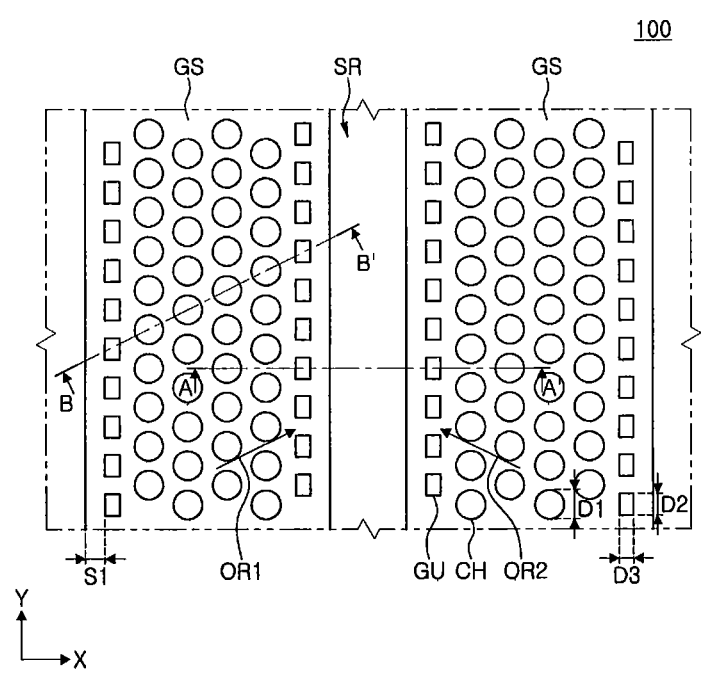
FIG. 3 is a schematic plan view of a semiconductor device according to an example embodiment of the present inventive concept.

FIG. 3 is a schematic plan view of a semiconductor device according to another example embodiment of the present inventive concept.

FIG. 3 is a schematic plan view illustrating portions of components of a memory cell array included in a semiconductor device 100 having a vertical structure. The semiconductor device 100 may include gate stacks GS, a plurality of channel regions CH and a plurality of guide regions GU that are disposed to penetrate through the gate stacks GS, and a separation region SR provided between the gate stacks GS adjacent to each other and extended in one direction, for example, in a y-direction.

The gate stacks GS may include the memory cells MC1 to MCn, gate electrodes of the ground select transistor GST and the string select transistor SST described with reference to FIG. 2, and the channel regions CH may include channel regions of the memory cells MC1 to MCn, the ground select transistor GST and the string select transistor SST.

The gate stacks GS may include gate electrodes of transistors in a plurality of memory cell arrays stacked in a direction not illustrated in FIG. 2. The gate stacks GS may be spaced apart from each other by a predetermined unit of distance in an x-direction. The gate stacks GS may extend in the y-direction and be connected to circuits of a peripheral circuit region in an area not illustrated in FIG. 2.

The channel regions CH may penetrate through the gate stacks GS and in a single gate stack GS, two channel regions CH may be disposed in parallel in the x-direction and the channel regions CH may be arranged in four rows in the y-direction. The channel regions CH disposed in adjacent rows may be disposed to be offset from each other. In the semiconductor device 100, a single memory cell string may be configured based on each channel region CH. In the example embodiment, four channel regions CH may be disposed in lines in each of first and second directions OR1 and OR2. However, the disposition of the channel regions CH may be variously modified depending on example embodiments, and the number of the channel regions CH arranged in one direction is not limited to that illustrated in the example embodiment.

The guide regions GU may penetrate through at least portions of the gate stacks GS and be disposed to be adjacent to end portions of the gate stacks GS in the x-direction. The guide regions GU may be arranged in a row in the y-direction to be adjacent to the separation region SR at either end portion of the gate stack GS. In an example embodiment, the guide regions GU may be disposed in a plurality of rows. The guide regions GU may be disposed to be spaced apart from one end portion of the gate stack GS by a predetermined distance S1 in an inward direction. In an example embodiment, the guide regions GU may come into contact with one end portion of the gate stack GS. The guide regions GU may be disposed outwardly of a region in which the channel regions CH are concentrated, whereby defects, such as the occurrence of a bending defect at the time of forming the channel regions CH may be reduced or prevented, and defects occurring when the channel regions CH and the separation region SR come into contact with each other at the time of forming the separation region SR may be prevented.

The guide regions GU may be arranged regularly with the channel regions CH. The guide regions GU may be arranged in the same manner as that of the channel regions CH. The guide regions GU may be arranged in the same arrangement manner as that of the channel regions CH and may be disposed in parallel with the channel regions CH in straight lines in the first and second directions OR1 and OR2.

Each of the guide regions GU may have a size similar to or smaller than that of each of the channel regions CH on an x-y plane. The guide region GU may have a rectangular shape or an oval shape in which it is elongated in the y-direction, and a length thereof D2 in the y-direction may be identical to or smaller than a length D1 of the channel region CH in the y-direction. A length D3 of the guide region GU in the x-direction may be smaller than the length D1 of the channel region CH in the x-direction. The size of the guide region GU may be determined in consideration of a degree of integration of the semiconductor device 100, a height of the gate stack GS, a size of the channel region CH and the like.

The separation region SR may be disposed between the gate stacks GS that are spaced apart from each other, and be extended in the y-direction. Depending on example embodiments, the common source line CSL (refer to FIG. 2) or a contact plug connected to the common source line CSL may be disposed on the separation region SR.

Figure 4:
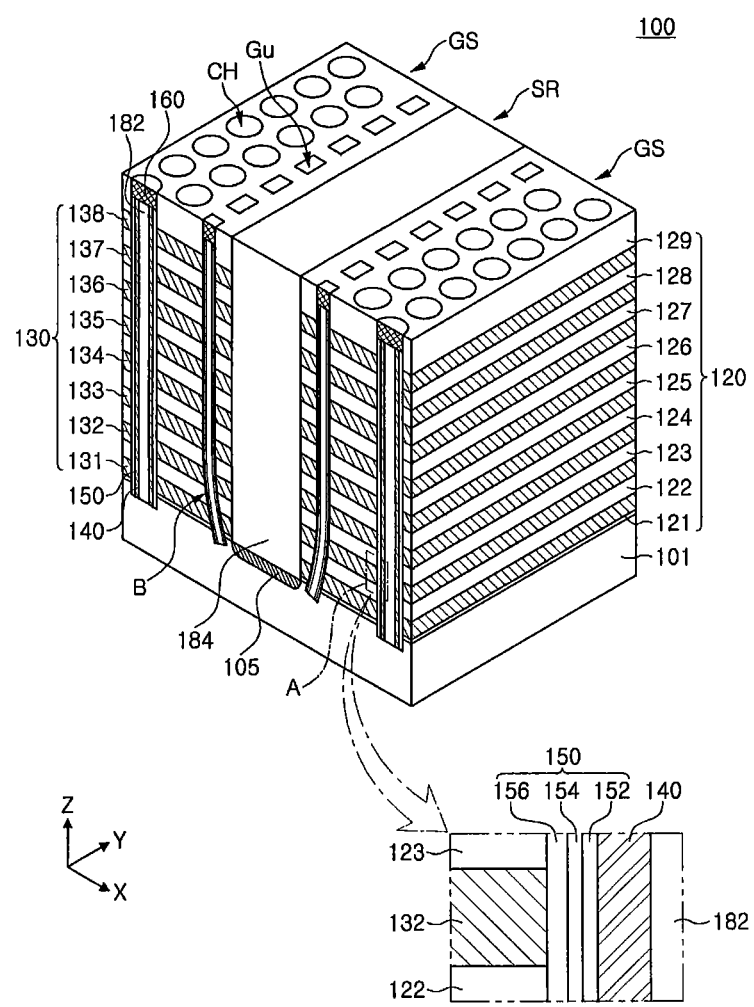
FIG. 4 is a schematic perspective view illustrating a structure of memory cell strings of a semiconductor device according to an example embodiment of the present inventive concept.

FIG. 4 is a schematic perspective view illustrating a structure of memory cell strings of a semiconductor device according to an example embodiment of the present inventive concept. FIG. 4 illustrates a partial region of the semiconductor device 100, including a cross-section taken along cut line A-A' in FIG. 3.

Figure 5:
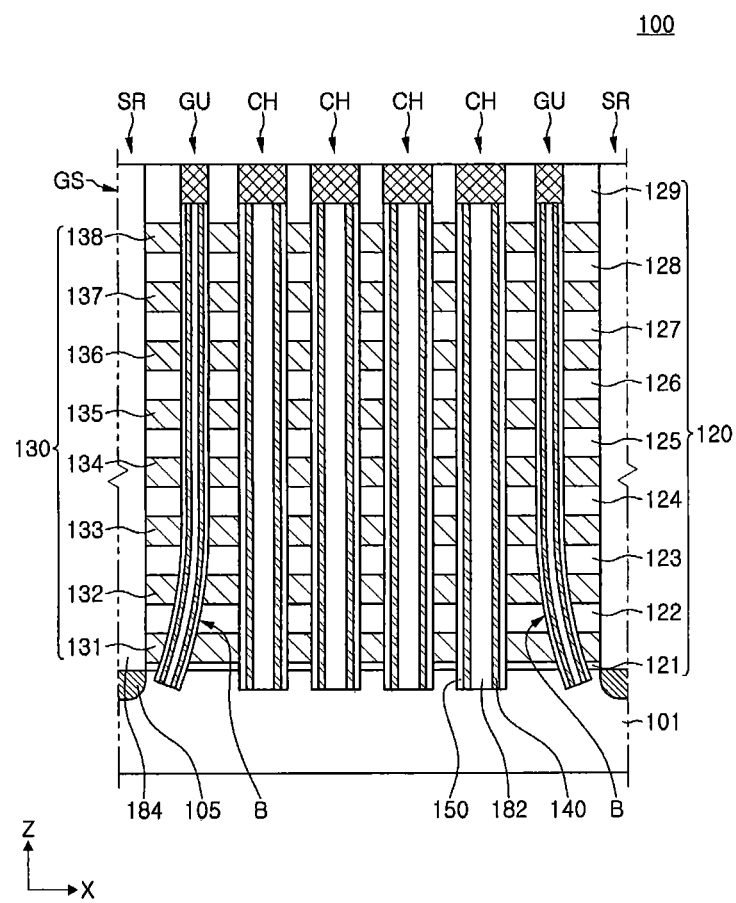
FIG. 5 is a schematic cross-sectional view illustrating the structure of memory cell strings of a semiconductor device according to an example embodiment of the present inventive concept.

FIG. 5 is a schematic cross-sectional view illustrating the structure of the memory cell strings of a semiconductor device according to an example embodiment of the present inventive concept. FIG. 5 illustrates a cross-section, taken along cut line B-B' in FIG. 3.

Some components such as an upper wiring structure may be omitted in FIGS. 4 and 5.

Referring to FIGS. 4 and 5, the semiconductor device 100 may include a substrate 101, a plurality of channel layers 140 disposed in a direction perpendicular with respect to an upper surface of the substrate 101, and a plurality of interlayer insulating layers 120 and a plurality of gate electrodes 130 that are stacked along outer sidewalls of the channel layers 140. The semiconductor device 100 may further include a gate dielectric layer 150 disposed between the gate electrodes 130 and each of the channel layers 140, channel pads 160 disposed on upper portions of the channel layers 140, and source regions 105.

In the semiconductor device 100, a single memory cell string may be configured based on each channel layer 140, and a plurality of memory cell strings may be arranged in rows and columns in the x- and y-directions, respectively. Each of the gate stacks GS may include the gate electrodes 130 and further include the interlayer insulating layers 120. The channel regions CH may include the channel layers 140. The separation region SR may include a second insulating layer 184 and may further include the source region 105. Each of the guide regions GU may have a bent portion B.

The substrate 101 may have the upper surface extended in the x-direction and the y-direction. The substrate 101 may contain a semiconductor material, for example, a group IV semiconductor, a group III-V compound semiconductor, or a group II-VI oxide semiconductor. For example, the group IV semiconductor may contain silicon, germanium, or silicon-germanium. The substrate 101 may be provided as a bulk wafer or an epitaxial layer.

The plurality of gate electrodes 130 (131 to 138) may be disposed along side walls of each of the channel layers 140 while being spaced apart from each other in the z-direction from the substrate 101. Referring to FIGS. 4 and 5, together with FIG. 2, the respective gate electrodes 130 may form the ground select transistor GST, the plurality of memory cells MC1 to MCn, and a gate of the string select transistor SST. The gate electrodes 130 may form the word lines WL1 to WLn to be extended and may be connected to each other in common in a predetermined unit of adjacent memory cell strings arranged in the x-direction and the y-direction. In an example embodiment, a total of five gate electrodes 132 to 136 of the memory cells MC1 to MCn may be arranged, but the example embodiment is merely illustrated by way of example. The number of the gate electrodes 130 forming the memory cells MC1 to MCn may be determined based on the capacity of the semiconductor device 100. For example, the number of the gate electrodes 130 forming the memory cells MC1 to MCn may be 2ⁿ (where n is a natural number).

The gate electrode 131 of the ground select transistor GST may be extended in the y-direction to form the ground select line GSL. For functions of the ground select transistor GST, a predetermined amount of an impurity may be doped within the substrate 101 disposed below the gate electrode 131.

The gate electrodes 137 and 138 of the string select transistor SST may be extended in the y-direction to form the string select line SSL. In the case of the gate electrodes 137 and 138 of the string select transistor SST disposed in a straight line in the x-direction, adjacent memory cell strings thereof may be connected to different bit lines BL1 and BLm (refer to FIG. 2) by a wiring structure in an upper portion of the gate electrodes. In an example embodiment, the gate electrodes 137 and 138 of the string select transistor SST may be separated from each other to form different string select lines SSL between the memory cell strings adjacent to each other in the x-direction. Depending on example embodiments of the present inventive concept, the gate electrodes 137 and 138 of the string select transistor SST may be singularly provided, and the gate electrode 131 of the ground select transistor GST may be singularly provided. Alternatively, two or more gate electrodes 137 and 138 of the string select transistor SST and two or more gate electrodes 131 of the ground select transistor GST may be provided. The gate electrodes 137 and 138 of the string select transistor SST and the gate electrode 131 of the ground select transistor GST may have structures different from those of the gate electrodes 132 to 136 of the memory cells MC1 to MCn.

Some of the gate electrodes 130, for example, the gate electrodes 130 adjacent to the gate electrode 131 of the ground select transistor GST or the gate electrodes 137 and 138 of the string select transistor SST may be dummy gate electrodes. For example, the gate electrode 132 adjacent to the gate electrode 131 of the ground select transistor GST may be a dummy gate electrode. Hereinafter, the term "dummy" is used to indicate a component having a structure and a shape the same as or similar to those of other components, but which is merely present as a pattern without possessing the ability to perform substantial functions. Therefore, an electrical signal may not be applied to a "dummy" component or the "dummy" component may not be able to perform certain electrical functions even in the case that an electrical signal is applied thereto.

The gate electrodes 130 may contain polycrystalline silicon or a metal silicide material. The metal silicide material may be a silicide material of a metal selected from among, for example, cobalt (Co), nickel (Ni), hafnium (Hf), platinum (Pt), tungsten (W) and titanium (Ti) or combinations thereof. Depending on example embodiments, the gate electrodes 130 may contain a metallic material, for example, tungsten (W). Although not separately illustrated in the example embodiment, the gate electrodes 130 may further include diffusion barriers and, for example, the diffusion barriers may contain tungsten nitride (WN), tantalum nitride (TaN), titanium nitride (TiN) or combinations thereof.

The plurality of interlayer insulating layers 120 (121 to 129) may be arranged between the gate electrodes 130. The interlayer insulating layers 120 may be spaced apart from each other in the z-direction and may be extended in the y-direction, in a similar manner to the gate electrodes 130. The interlayer insulating layers 120 may contain an insulating material such as a silicon oxide or a silicon nitride.

The configuration of layers configuring the channel regions CH may be identical to or similar to that of the guide regions GU. Both of the channel regions CH and the guide regions GU may include the channel layers 140. Each of the channel regions CH and the guide regions GU may further include the gate dielectric layer 150, a first insulating layer 182 and the channel pad 160. However, the guide region GU may have the bent portion B bent in a direction toward the separation region SR, unlike the channel region CH. The bent portion B may refer to a part of the guide region GU bent outside of the direction perpendicular to the upper surface of the substrate 101, that is, the z-direction. The bent portion B may be disposed in a lower portion of the guide region GU adjacent to the substrate 101. A degree of bending of the bent portion B, a position of a bending start point thereof, a lower surface shape thereof, and the like are not limited to those illustrated in the example embodiment, and may be variously changed depending on example embodiments. Due to the bent portion B, the channel layer 140, the gate dielectric layer 150 and the first insulating layer 182 may be bent in a portion of the guide region GU.

Each of the channel layers 140 may have a pillar shape and may be extended in the z-direction, the direction perpendicular with respect to the upper surface of the substrate 101. Each of the channel layers 140 may have an annular shape so as to encompass the first insulating layer 182 disposed therein, but is not limited thereto. The channel layer 140 may have a pillar shape, such as a prismatic shape or a cylindrical shape in which the first insulating layer 182 is not present. In another example embodiment, the channel layers 140 may have inclined side surfaces narrowed in a direction toward the substrate 101 in accordance with an increase in an aspect ratio thereof. The plurality of channel layers 140 may be spaced apart from each other in the x-direction and the y-direction and may be disposed in rows in the y-direction. However, the disposition of the channel layers 140 may be variously formed depending on example embodiments and are not limited to those illustrated in the example embodiment.

The channel layers 140 may be connected to the substrate 101 on lower surfaces thereof. The channel layers 140 may contain a semiconductor material, such as polycrystalline silicon or single crystal silicon, and the semiconductor material may be an undoped material or a material containing p-type or n-type impurities.

The gate dielectric layer 150 may be disposed between the gate electrodes 130 and the channel layer 140. As illustrated in an enlarged view in FIG. 4, the gate dielectric layer 150 may include a tunneling layer 152, a charge storing layer 154, and a blocking layer 156 that are sequentially stacked from the channel layer 140. In the example embodiment, the gate dielectric layer 150 may be vertically extended along the channel layer 140 on the substrate 101.

The tunneling layer 152 may tunnel charges to the charge storing layer 154, using the Fowler-Nordheim (F-N) tunneling method. The tunneling layer 152 may contain, for example, a silicon oxide. The charge storing layer 154 may be a charge trapping layer or a floating gate conductive layer. For example, the charge storing layer 154 may contain a dielectric material, quantum dots or nanocrystals. Here, the quantum dots or the nanocrystals may comprise fine conductor particles, for example, metal or semiconductor nanoparticles. In an example embodiment, when the charge storing layer 154 is a charge trapping layer, the charge storing layer 154 may be formed of a silicon nitride. The blocking layer 156 may contain a high-K dielectric material.

Here, the high-K dielectric material refers to a dielectric material having a higher dielectric constant than that of a silicon dioxide.

Each of the channel pads 160 may be disposed to cover an upper surface of the first insulating layer 182 and be electrically connected to the channel layer 140, at the top of the memory cell strings. The channel pad 160 may contain, for example, doped polycrystalline silicon. The channel pad 160 may serve as a drain region of the string select transistor SST (refer to FIG. 2) and may be electrically connected to the bit lines BL1 to BLm. A conductive contact plug may be further disposed between the channel pad 160 and the bit lines BL1 to BLm.

The source regions 105 of the ground select transistors GST (refer to FIG. 2) arranged in the x-direction may be disposed at the bottom of the memory cell strings. The source regions 105 may be adjacent to the upper surface of the substrate 101 and be extended in the y-direction while being spaced apart from each other by a predetermined unit of distance in the x-direction. For example, a single source region 105 may be disposed every two channel regions CH in the x-direction, but is not limited thereto. The second insulating layer 184 may be disposed on each of the source regions 105. In an example embodiment, a conductive layer forming the common source line CSL (refer to FIG. 2) or a contact plug connected to the common source line CSL may be further disposed on the source region 105. The conductive layer may contain tungsten (W), aluminum (Al) or copper (Cu).

In a case in which the source regions 105 have a conductivity type opposite to that of the substrate 101, the source regions 105 may serve as sources of the ground select transistors GST adjacent to each other. In a case in which the source regions 105 have a conductivity type the same as that of the substrate 101, the source regions 105 may function as a pocket P well contact portion for an erase operation of block units of the memory cell strings. In this case, data stored in all memory cells in a corresponding memory cell block of the substrate 101 may be erased by applying a high voltage to the substrate 101 through the pocket P well contact portion.

Figure 6A:
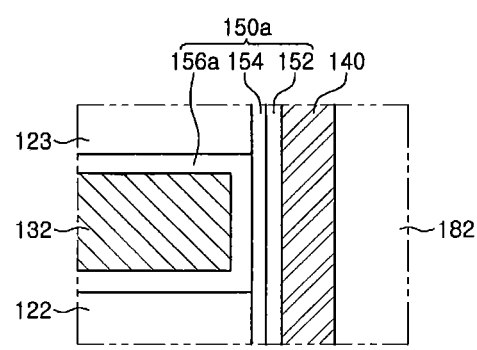
FIGS. 6A through 6C are cross-sectional views illustrating a gate dielectric layer according to an example embodiment of the present inventive concept, which respectively illustrate regions corresponding to region 'A' of FIG. 4.
Figure 6B:
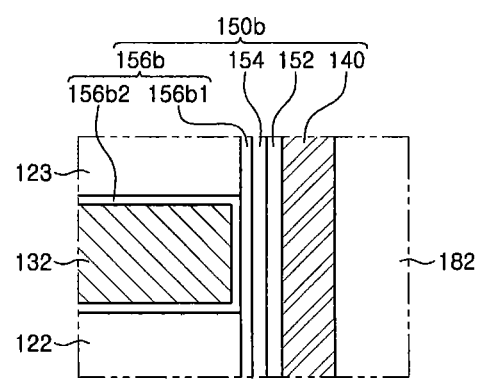
Figure 6C:
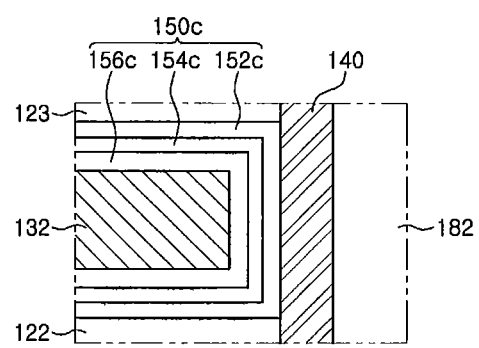

FIGS. 6A through 6C, which are cross-sectional views illustrating a gate dielectric layer according to an example embodiment of the present inventive concept, respectively illustrate regions corresponding to region 'A' of FIG. 4.

Referring to FIG. 6A, the gate electrode 132, a gate dielectric layer 150a, and the channel layer 140 of the memory cell strings are illustrated. The gate dielectric layer 150a may have a structure comprising the tunneling layer 152, the charge storing layer 154, and a blocking layer 156a sequentially stacked from the channel layer 140. Relative thicknesses of the layers forming the gate dielectric layer 150a are not limited to those illustrated in the drawings and may be variously changed.

In particular, unlike the embodiment of FIG. 4, the gate dielectric layer 150a according to an example embodiment may be disposed such that the tunneling layer 152 and the charge storing layer 154 may be extended in a vertical direction along the channel layer 140, while the blocking layer 156a may encompass the gate electrode 132.

The tunneling layer 152 may contain silicon dioxide ($SiO_2$), silicon nitride ($Si_3N_4$), silicon oxynitride (SiON), or combinations thereof.

The charge storing layer 154 may be a charge trapping layer or a floating gate conductive layer. When the charge storing layer 154 is a floating gate conductive layer, the charge storing layer 154 may be formed through the deposition of polycrystalline silicon by performing chemical vapor deposition (CVD), for example, low pressure CVD (LPCVD). When the charge storing layer 154 is a charge trapping layer, the charge storing layer 154 may contain silicon dioxide ($SiO_2$), silicon nitride ($Si_3N_4$), silicon oxynitride (SiON), hafnium oxide ($HfO_2$), zirconium oxide ($ZrO_2$), tantalum oxide ($Ta_2O_3$), titanium oxide ($TiO_2$), hafnium aluminum oxide ($HfAl_xO_y$), hafnium tantalum oxide ($HfTa_xO_y$), hafnium silicon oxide ($HfSi_xO_y$), aluminum nitride ($Al_xN_y$), aluminum gallium nitride ($AlGa_xN_y$) or combinations thereof.

The blocking layer 156a may contain silicon dioxide ($SiO_2$), silicon nitride ($Si_3N_4$), silicon oxynitride (SiON), a high-k dielectric material or combinations thereof. The high-k dielectric material may be at least one of aluminum oxide ($Al_2O_3$), tantalum oxide ($Ta_2O_3$), titanium oxide ($TiO_2$), yttrium oxide ($Y_2O_3$), zirconium oxide ($ZrO_2$), zirconium silicon oxide ($ZrSi_xO_y$), hafnium oxide ($HfO_2$), hafnium silicon oxide ($HfSi_xO_y$), lanthanum oxide ($La_2O_3$), lanthanum aluminum oxide ($LaAl_xO_y$), lanthanum hafnium oxide ($LaHf_xO_y$), hafnium aluminum oxide ($HfAl_xO_y$), and praseodymium oxide ($Pr_2O_3$).

Referring to FIG. 6B, the gate electrode 132, a gate dielectric layer 150b, and the channel layer 140 of the memory cell strings are illustrated. The gate dielectric layer 150b may have a structure having the tunneling layer 152, the charge storing layer 154, and blocking layers 156b sequentially stacked from the channel layer 140.

In particular, unlike the embodiments of FIGS. 4 and 6A, in the gate dielectric layer 150b according to the example embodiment of the present inventive concept, the blocking layer 156b may include two blocking layers 156b1 and 156b2 and in that case, a first blocking layer 156b1 may be vertically extended, similarly to the channel layer 140, and a second blocking layer 156b2 may be disposed to encompass the gate electrode 132. For example, the first blocking layer 156b1 may be a relatively low dielectric layer, and the second blocking layer 156b2 may be a relatively high dielectric layer. In this case, the first blocking layer 156b1 may be disposed on a side surface of the second blocking layer 156b2, whereby an energy band, such as a barrier height may be controlled to allow for improvements in characteristics of the semiconductor device, for example, erase characteristics.

Referring to FIG. 6C, the gate electrode 132, a gate dielectric layer 150c, and the channel layer 140 of the memory cell strings are illustrated. The gate dielectric layer 150c may have a structure comprising a tunneling layer 152c, a charge storing layer 154c, and a blocking layer 156c sequentially stacked from the channel layer 140.

In particular, unlike the embodiment of FIGS. 3, 6A and 6B, the gate dielectric layer 150c according to the example embodiment may be disposed such that all of the tunneling layer 152c, the charge storing layer 154c, and the blocking layer 156c may encompass the gate electrode 132.

Figure 7:
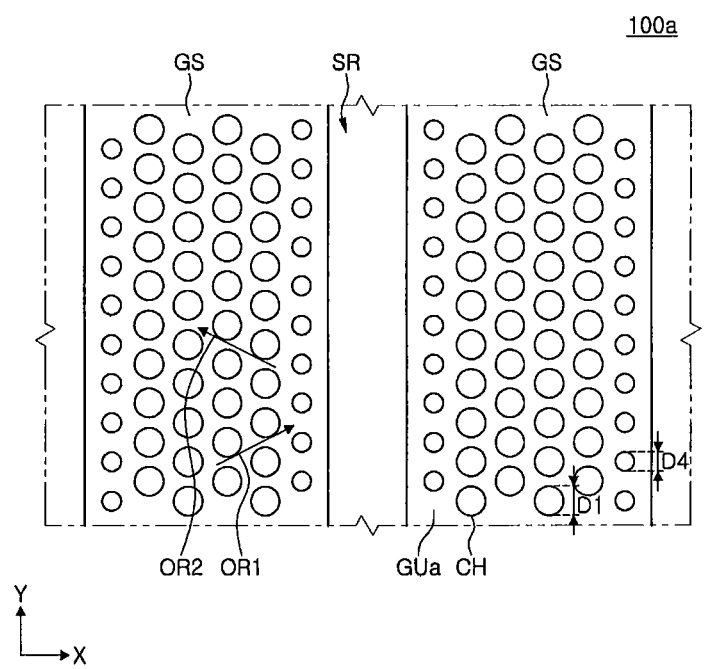
FIGS. 7 through 12 are schematic views respectively illustrating a semiconductor device according to an example embodiment of the present inventive concept.
Figure 8:
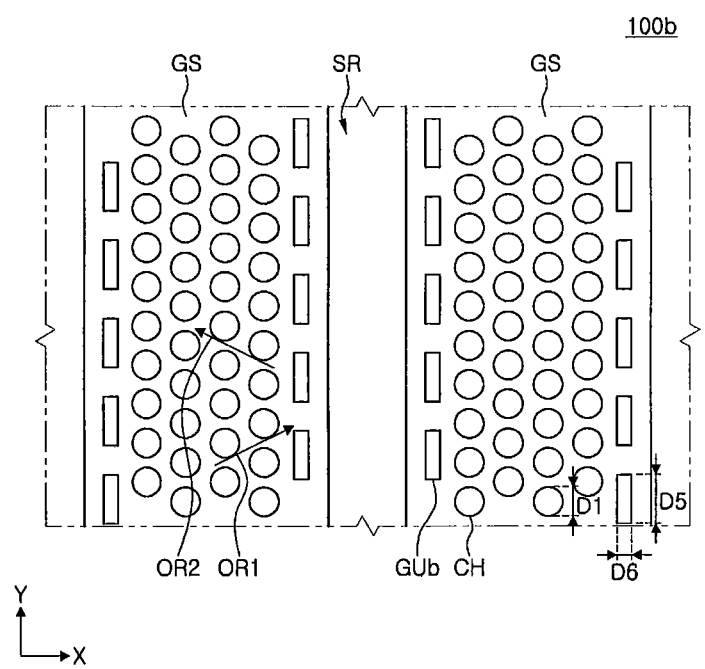

FIGS. 7 through 12 are schematic views respectively illustrating a semiconductor device according to an example embodiment of the present inventive concept. FIGS. 7, 8 and 9A are schematic plan views and FIG. 9B and FIGS. 10 to 12 are schematic cross-sectional views.

Referring to FIG. 7, a semiconductor device 100a may include the gate stacks GS, the plurality of channel regions CH and a plurality of guide regions GUa that are disposed to penetrate through the gate stacks GS, and the separation region SR provided between the gate stacks GS adjacent to each other and extended in one direction, for example, in a y-direction.

Unlike the example embodiment of FIG. 3, each of the guide regions GUa may have a circular shape in an x-y plane. Each of the guide regions GUa may have a size similar to or smaller than that of each of the channel regions CH on the x-y plane. A length D4 of the guide region GUa may be identical to or smaller than the length D1 of the channel region CH.

The guide regions GUa may be arranged in the same manner as that of the channel regions CH. The guide regions GUa may be arranged in the same arrangement manner as that of the channel regions CH and may be disposed in parallel with the channel regions CH in straight lines, in first and second directions OR1 and OR2.

Referring to FIG. 8, a semiconductor device 100b may include the gate stacks GS, the plurality of channel regions CH and a plurality of guide regions GUb that are disposed to penetrate through the gate stacks GS, and the separation region SR provided between the gate stacks GS adjacent to each other and extended in one direction, for example, in a y-direction.

The number of the guide regions GUb arranged in the example embodiment may be less than those of the foregoing example embodiments illustrated in FIGS. 3 and 7. Thus, the guide regions GUb may not be arranged in exactly the same manner as that of the channel regions CH. In this case, the guide regions GUb may be arranged at regular intervals in the y-direction.

Each of the guide regions GUb may have a rectangular shape or an oval shape in which it is elongated in the y-direction, and a length thereof D5 in the y-direction may be greater than the length D1 of the channel region CH in the y-direction. A length D6 of the guide region GUb in the x-direction may be smaller than the length D1 of the channel region CH in the x-direction.

Figure 9A:
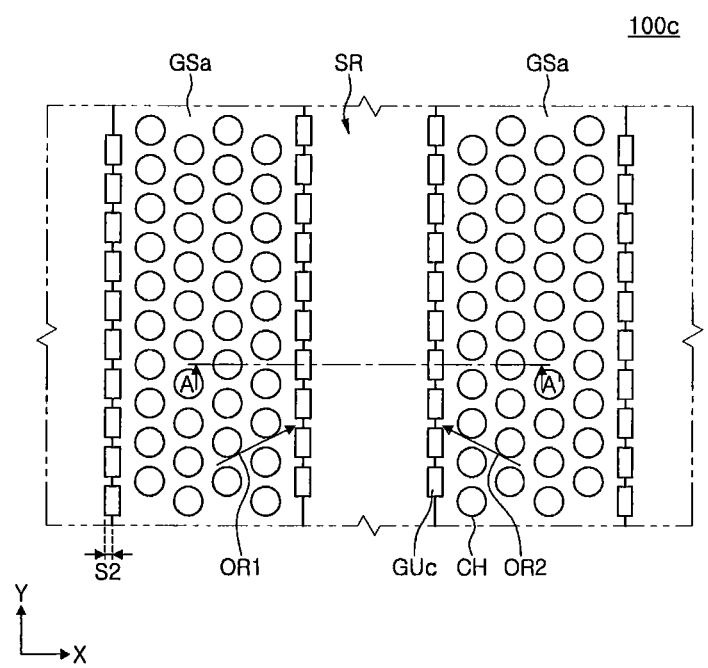
Figure 9B:
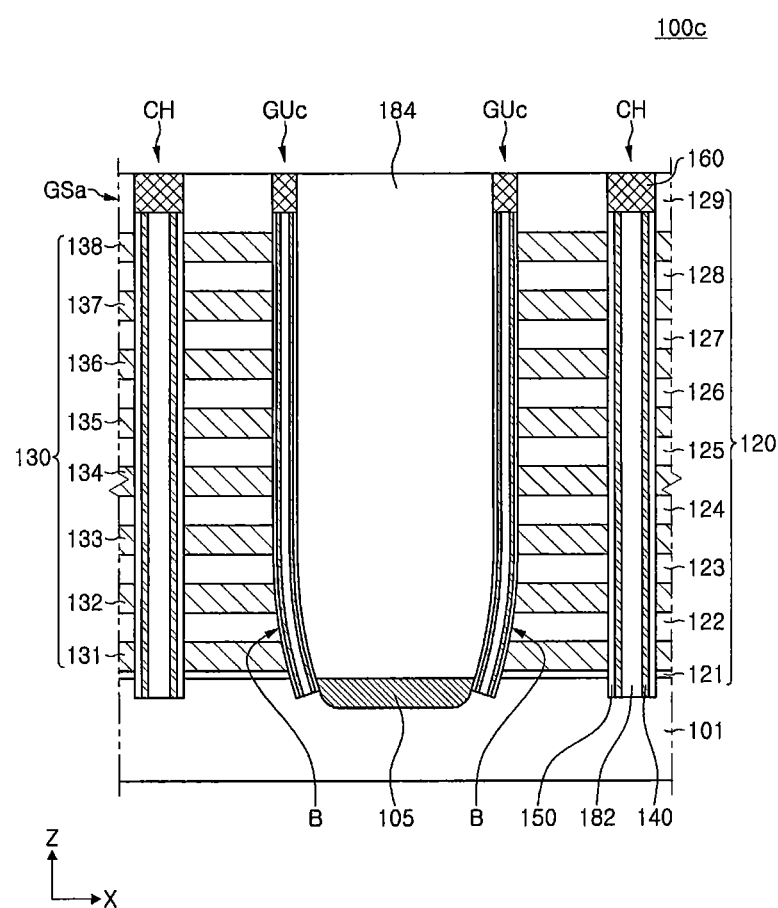

Referring to FIGS. 9A and 9B, a semiconductor device 100c may include gate stacks GSa, the plurality of channel regions CH and a plurality of guide regions GUc that are disposed to penetrate through the gate stacks GSa, and the separation region SR provided between the gate stacks GSa adjacent to each other and extended in one direction, for example, in a y-direction.

Unlike the example embodiment of FIG. 3, the guide regions GUc may be positioned on end portions of the gate stacks GSa. The guide regions GUc may not be completely enclosed by the gate stacks GSa but only portions thereof may be enclosed by the gate stacks GSa and thus, remaining portions thereof may be exposed to the separation region SR. The guide regions GUc may protrude a predetermined distance S2 from one end portion of the gate stack GSa to the separation region SR. The distance S2 by which the guide regions GUc protrude may be variously changed in example embodiments.

As illustrated in FIG. 9B, the guide regions GUc may be partially exposed through the separation region SR and the exposed portions may be covered with the second insulating layer 184.

Figure 10:
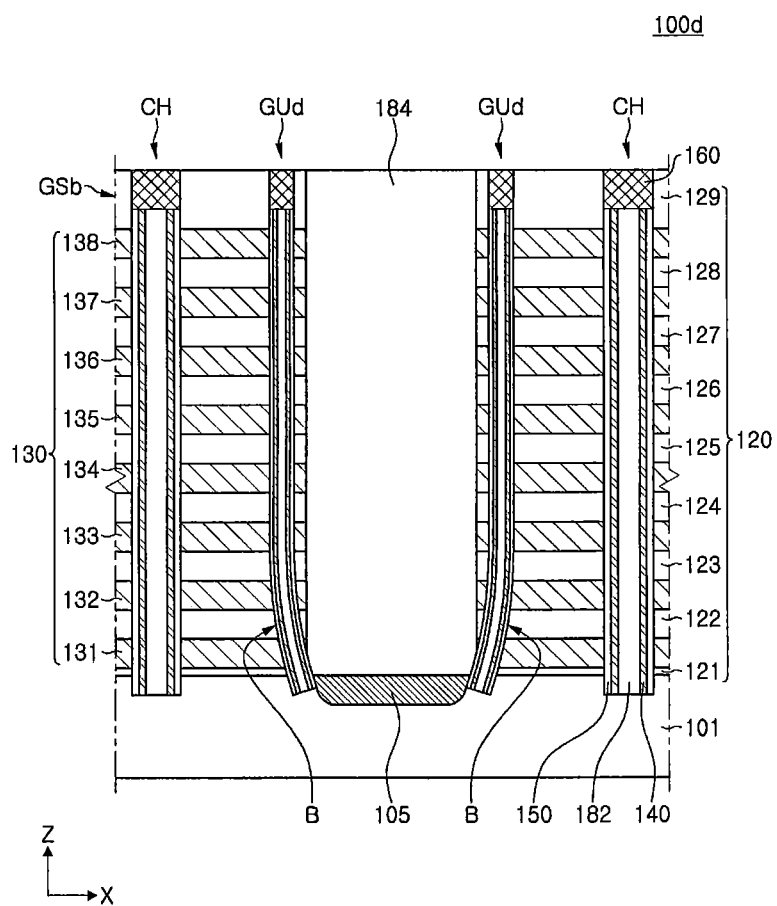

Referring to FIG. 10, a semiconductor device 100d may include gate stacks GSb, the plurality of channel regions CH and a plurality of guide regions GUd that are disposed to penetrate through the gate stacks GSb, and the separation region SR (refer to FIG. 9A) provided between the gate stacks GSb adjacent to each other and extended in one direction, for example, in a y-direction.

In the example embodiment, only portions of the guide regions GUd may be exposed through the separation region SR, and the exposed portions may be merely portions of lower portions of the guide regions GUd in which the bent portions B are formed.

Figure 11:
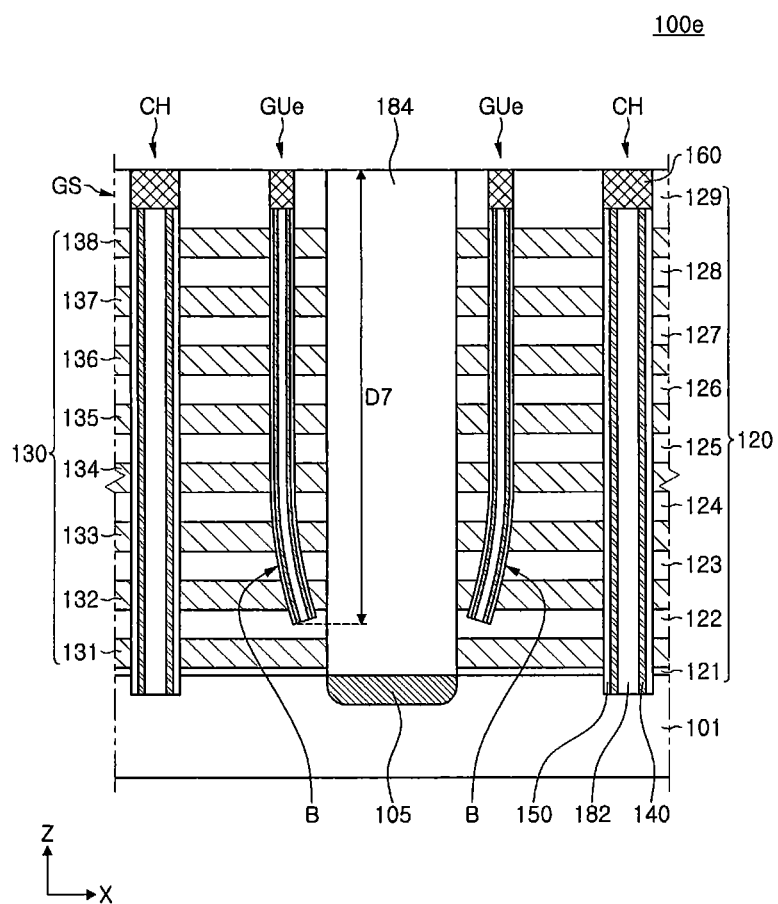

Referring to FIG. 11, a semiconductor device 100e may include the gate stacks GS, the plurality of channel regions CH and a plurality of guide regions GUe that are disposed to penetrate through the gate stacks GS, and the separation region SR (refer to FIG. 9A) provided between the gate stacks GS adjacent to each other and extended in one direction, for example, in a y-direction.

Unlike the example embodiment of FIG. 3, the guide regions GUe according to the example embodiment may partially penetrate through the gate stacks GS and thus, may not be connected to the substrate 101. Depths D7 of the guide regions GUe from upper surfaces of the gate stacks GS or an upper surface of the second insulating layer 184 forming the separation region SR may be smaller than heights of the gate stacks GS, and may be variously changed in example embodiments.

Below the guide regions GUe, the interlayer insulating layers 120 and the gate electrodes 130 that have not been penetrated by the guide regions GUe may be extended in the x-direction.

Figure 12:
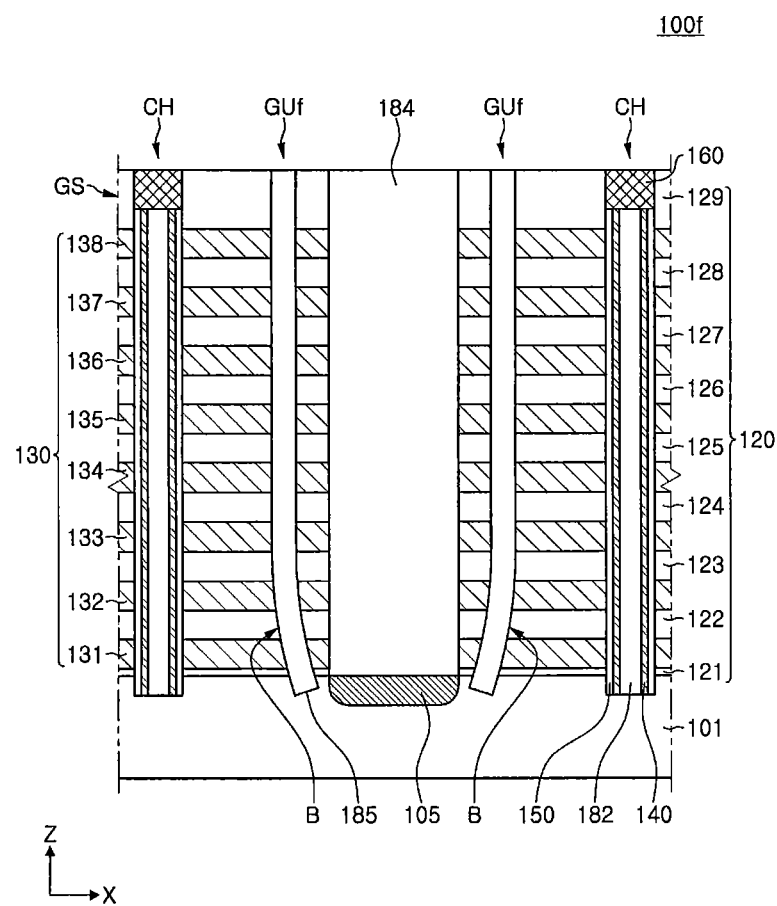

Referring to FIG. 12, a semiconductor device 100f may include the gate stacks GS, the plurality of channel regions CH and a plurality of guide regions GUf that are disposed to penetrate through the gate stacks GS, and the separation region SR (refer to FIG. 9A) provided between the gate stacks GS adjacent to each other and extended in one direction, for example, in a y-direction.

Unlike the example embodiment of FIG. 3, the guide regions GUf may have different structures from those of the channel regions CH. Each of the guide regions GUf may not include the channel layer 140, but may include a buried layer 185. The buried layer 185 may be formed of an insulating material, but is not limited thereto. In an example embodiment, the buried layer 185 may be formed of at least a portion of the gate dielectric layer 150.

FIGS. 13 through 20 are schematic views of respective main processes, illustrating a method of manufacturing a semiconductor device according to an example embodiment of the present inventive concept. FIGS. 13 through 20 illustrate regions corresponding to an x-z cross-section of the prospective view illustrated in FIG. 4.

Figure 13:
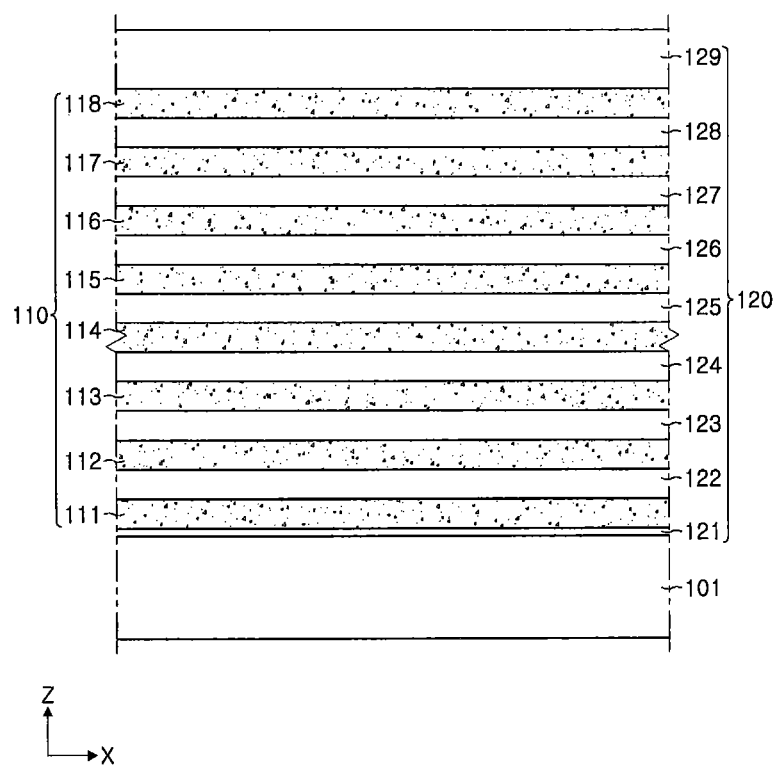
FIGS. 13 through 20 are schematic views of respective main processes illustrating a method of manufacturing a semiconductor device according to an example embodiment of the present inventive concept.

Referring to FIG. 13, sacrificial layers 110 (111 to 118) and the interlayer insulating layers 120 may be alternately stacked on the substrate 101.

As illustrated in the embodiment, the interlayer insulating layers 120 and the sacrificial layers 110 may be alternately stacked on the substrate 101, with the beginning of the first interlayer insulating layer 121. The sacrificial layers 110 may be formed of an etchable material having etch selectivity with respect to the interlayer insulating layers 120. That is, the sacrificial layers 110 may be formed of a material capable of being etched while significantly decreasing etching of the interlayer insulating layers 120 during a process of etching the sacrificial layers 110. Such an etch selectivity or an etch selection ratio may be quantitatively represented by a ratio of an etch rate of the sacrificial layers 110 to an etch rate of the interlayer insulating layers 120. For example, the interlayer insulating layer 120 may be formed of at least one of a silicon oxide layer and silicon nitride, and the sacrificial layer 110 may be formed of a material different from that of the interlayer insulating layer 120 selected from a group consisting of silicon, silicon oxide, silicon carbide and silicon nitride.

As illustrated in the example embodiment, thicknesses of the interlayer insulating layers 120 may not be the same as each other. The lowermost interlayer insulating layer 121 of the interlayer insulating layers 120 may be relatively thinly formed, and the uppermost interlayer insulating layer 129 thereof may be relatively thickly formed. In an example embodiment, the interlayer insulating layers 122 and 127 disposed between the ground select transistor GST and the string select transistor SST, and the memory cells MC1 to MCn illustrated in FIG. 2 may be relatively thicker than the interlayer insulating layers 123 to 126 disposed between the memory cells MC1 to MCn. However, thicknesses of the interlayer insulating layers 120 and the sacrificial layers 110 may be variously modified from those illustrated in the example embodiment, and the number of layers comprising the interlayer insulating layers 120 and the sacrificial layers 110 may also be variously modified.

In an example embodiment, a predetermined amount of an impurity may be doped within the substrate 101 in a position thereof corresponding to the gate electrode 131 (refer to FIG. 4) for electrical operations between the source region 105 and the ground select transistor GST.

Figure 14:
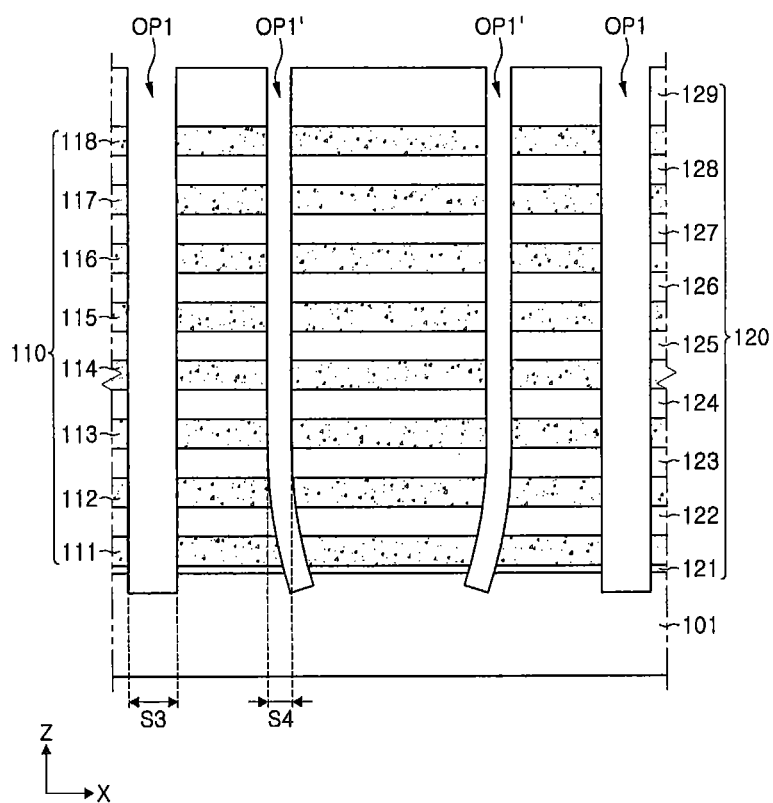

Referring to FIG. 14, first openings OP1 and OP1' in the form of holes penetrating through the sacrificial layers 110 and the interlayer insulating layers 120 may be formed. The first openings OP1 and OP1' may be disposed to correspond to the channel regions CH and the guide regions GU, respectively, which are described with reference to FIGS. 3 and 4.

The first openings OP1 and OP1' may be formed by anisotropically etching the sacrificial layers 110 and the interlayer insulating layers 120 using a mask layer. Because a stacked structure including two different types of layers is etched, sidewalls of the first openings OP1 and OP1' may not be perpendicular with respect to the upper surface of the substrate 101. For example, widths of the first openings OP1 and OP1' may be reduced in a direction toward the upper surface of the substrate 101. Portions of the substrate 101 may be recessed by the first openings OP1 and OP1'.

The first openings OP1 and OP1' may include the first openings OP1 in which the channel regions CH are formed and the first openings OP1' in which the guide regions GU are formed. The first openings OP1 of the channel regions CH may have sizes different from those of the first openings OP1' of the guide regions GU. For example, the first opening OP1 of each channel region CH may have a size S3 greater than or equal to a size S4 of the first opening OP1' of each guide region GU. The first openings OP1' of the guide regions GU, adjacent to each other, may be bent toward each other in portions thereof adjacent to the substrate 101. As heights of residual portions of the mask layer may be different due to a difference in pattern density between a region having the first openings OP1 and OP1' formed therein and a region having no first openings OP1 and OP1' formed therein, a charge accumulation may be generated during the etching process and thus, ion flux may be generated, thereby forming such a bending phenomenon.

In an example embodiment, an epitaxial layer may be formed on the recessed regions of the substrate 101. An upper surface of the epitaxial layer may be disposed at a position higher than that of the upper surface of the sacrificial layer 111 which is to be replaced by the gate electrode 131 of the ground select transistor GST (refer to FIG. 2).

Figure 15:
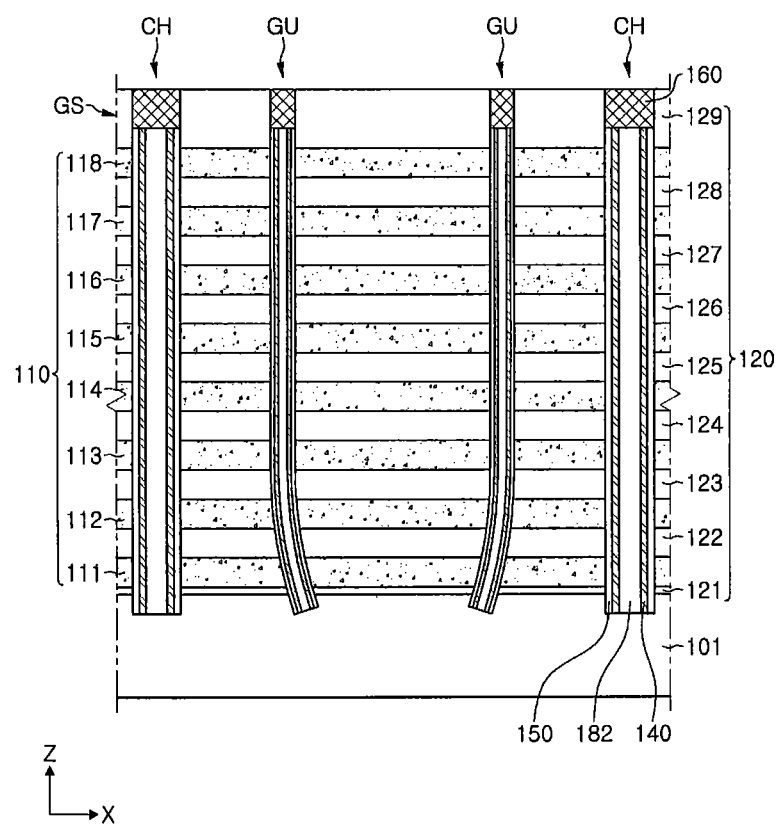

Referring to FIG. 15, the gate dielectric layer 150, channel layers 140 and the channel pads 160 may be formed within the first openings OP1 and OP1', whereby the channel regions CH and the guide regions GU may be formed within the first openings OP1 and OP1'. Thicknesses of the channel layers 140 and the gate dielectric layers 150 disposed in the channel regions CH and the guide regions GU may be identical to each other or different from each other, but are not limited to those illustrated in the example embodiment.

The gate dielectric layers 150 may be respectively formed to have a uniform thickness by an atomic layer deposition (ALD) process or a chemical vapor deposition (CVD) process. In the process, the entirety or only a portion of the gate dielectric layer 150 may be formed, and as illustrated in the foregoing example embodiments with reference to FIGS. 6A through 6C, a portion of the gate dielectric layer 150 extended be perpendicular with respect to the substrate 101 along each channel layer 140 may be formed in the process.

To allow the channel layers 140 to directly contact the substrate 101, the gate dielectric layers 150 formed within the first openings OP1 on the upper surface of the substrate 101 may be partially removed.

The first insulating layer 182 may be formed to fill each of the first openings OP1 and OP1' and may be formed of an insulating material. However, in some example embodiments, a conductive material rather than the first insulating layer 182 may fill an internal space of the channel layer 140.

The channel pads 160 may be formed of a conductive material. The channel pads 160 may be electrically connected to the channel layers 140 and electrically connect the channel layers 140 to the bit lines BL1 to BLm (refer to FIG. 2) to be formed in a subsequent process.

Figure 16:
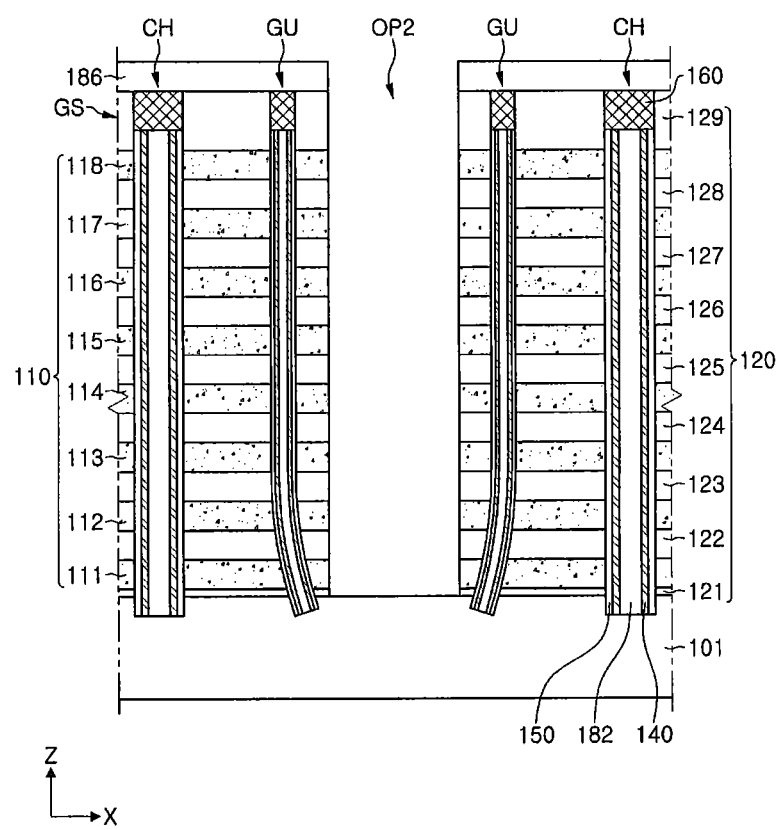

Referring to FIG. 16, a second opening OP2 separating the sacrificial layers 110 and the interlayer insulating layers 120 by a predetermined distance may be formed.

Prior to the formation of the second opening OP2, a third insulating layer 186 may be additionally formed on the uppermost interlayer insulating layer 129 and the channel pad 160 disposed thereon, whereby damage to the channel pad 160 and the channel layer 140 disposed therebelow may be prevented.

The second opening OP2 may be formed by forming a mask layer using a photolithography process and then anisotropically etching a laminate of the sacrificial layers 110 and the interlayer insulating layers 120. The second opening OP2 may be formed as a trench extended in a y-direction (refer to FIG. 4). The second opening OP2 may allow the substrate 101 to be exposed between the gate stacks GS. The second opening OP2 may be formed, such that the gate stacks GS (refer to FIGS. 3 and 4) may be separated from each other.

In the process, like the separation region SR described with reference to FIG. 3, the second opening OP2 may be formed between the guide regions GU. Thus, the second opening OP2 may be self-aligned by the guide regions GU. That is, because the guide regions GU are formed in advance, the bending of the second opening OP2 itself may be prevented.

Figure 17:
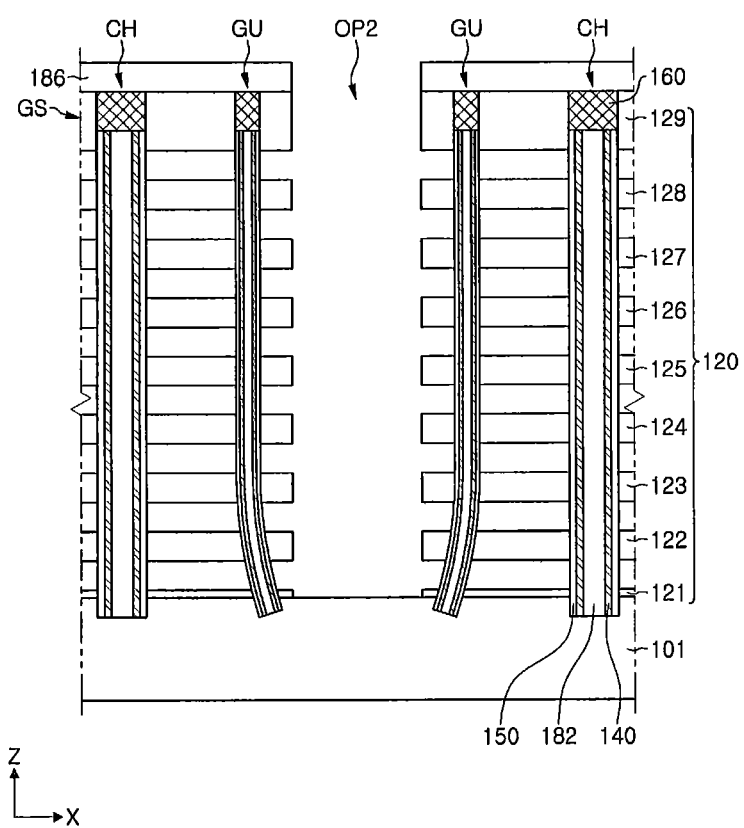

Referring to FIG. 17, the sacrificial layers 110 may be removed by an etching process.

The sacrificial layers 110 may be selectively removed by an etchant introduced through the second opening OP2. The sacrificial layers 110 are removed, whereby a plurality of lateral openings may be formed between the interlayer insulating layers 120. The sidewall of the gate dielectric layer 150 may be partially exposed through the lateral openings.

In an example embodiment, in the process described with reference to FIG. 13, in the case that instead of the sacrificial layers 110, conductive layers used as gate electrodes and the interlayer insulating layers 120 are alternately stacked, the process of removing the sacrificial layers 110 and a process of forming the gate electrodes 130 to be described with reference to FIG. 18 may be omitted.

Figure 18:
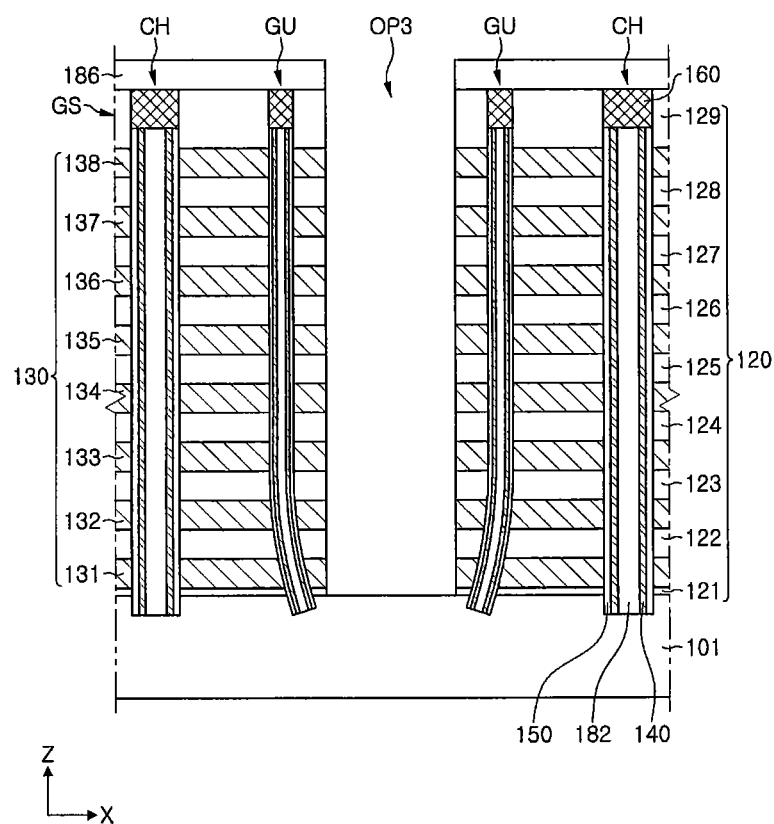

Referring to FIG. 18, the gate electrodes 130 may be formed within the lateral openings from which the sacrificial layers 110 have been removed to thereby form a third opening OP3.

The gate electrodes 130 may contain a metal, polycrystalline silicon or a metal silicide material. The metal silicide material may be a silicide material of a metal selected from among, for example, cobalt (Co), nickel (Ni), hafnium (Hf), platinum (Pt), tungsten (W) and titanium (Ti) or combinations thereof. In the case that the gate electrodes 130 are formed of a metal silicide material, the gate electrodes 130 may be formed by filling the interiors of the lateral openings with silicon (Si) and then forming a separate metal layer to perform a silicide process.

In the case of example embodiments in which layers including a portion of the gate dielectric layer 150 are disposed to encompass the gate electrodes 130 as in the foregoing example embodiments described with reference to FIGS. 6A through 6C, the gate dielectric layer 150 may be formed and manufactured first, prior to the formation of the gate electrodes 130 in the process.

After the formation of the gate electrodes 130, a material forming the gate electrodes 130 within the second opening OP2 may be removed through an additional process in such a manner that the gate electrodes 130 may be present only within the lateral openings, thereby forming the third opening OP3.

Figure 19:
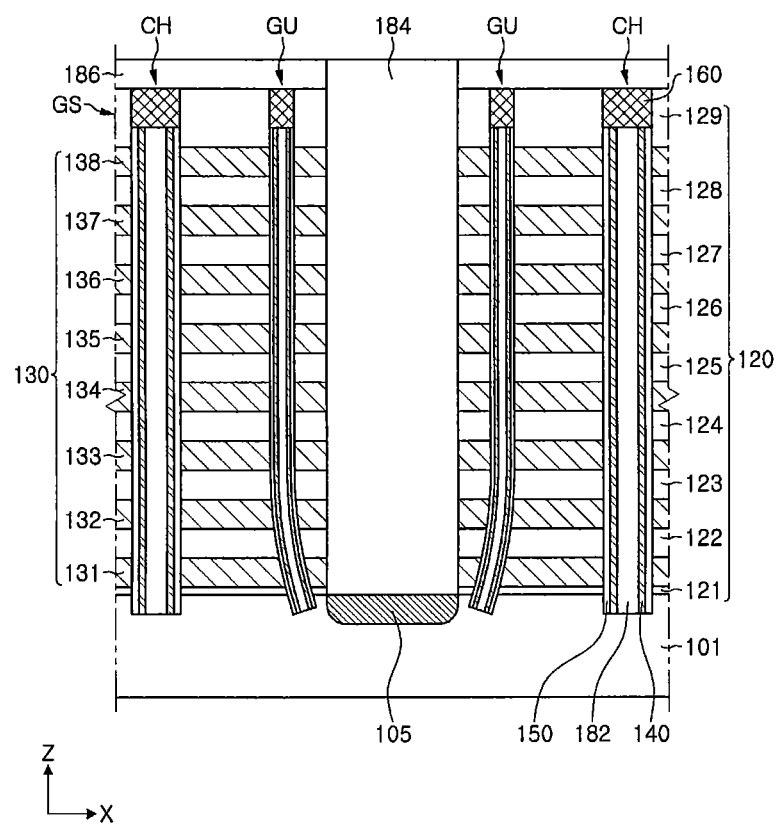

Referring to FIG. 19, the source region 105 may be formed in a region of the substrate 101 within the third opening OP3, and the second insulating layer 184 may be formed on the source region 105.

First, an impurity may be introduced in the exposed portion of the substrate 101 exposed by the third opening OP3 to form the source region 105. Then, the second insulating layer 184 may be formed on a sidewall of the opening OP3. In an example embodiment, the source region 105 may be formed after the second insulating layer 184 is formed. In an example embodiment, the common source line CSL (refer to FIG. 2) or a contact plug connected to the common source line CSL may be disposed on the source region 105.

Figure 20:
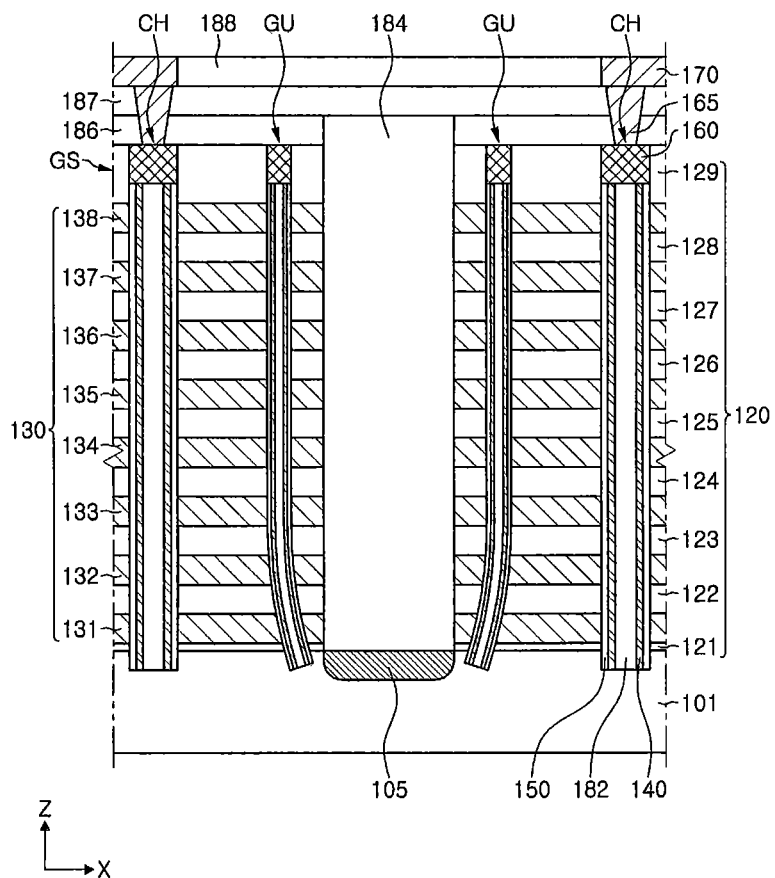

Referring to FIG. 20, contact plugs 165 and wiring lines 170 may be formed.

First, a fourth insulating layer 187 may be formed, and the contact plugs 165 penetrating through the third and fourth insulating layers 186 and 187 to be connected to the channel pads 160 may be formed. After forming contact holes penetrating through the third and fourth insulating layers 186 and 187, a conductive material may formed in the contact holes to thereby form the contact plugs 165. The contact plugs 165 may not be formed on the channel pads 160 of the guide regions GU. In another exemplary embodiment, the contact plugs 165 may be formed on the channel pads 160 of the guide regions GU, but the wiring lines 170 connected to the contact plugs 165 on the guide regions GU may not be formed.

Then, a fifth insulating layer 188 may be formed, and the wiring lines 170 may be formed to be connected to the contact plugs 165. The wiring lines 170 may be bit lines BL1 to BLm (refer to FIG. 2) or may be wirings connected to the bit lines BL1 to BLm.

The contact plugs 165 and the wiring lines 170 may contain a conductive material, for example, tungsten (W), aluminum (Al), or copper (Cu).

Figure 21:
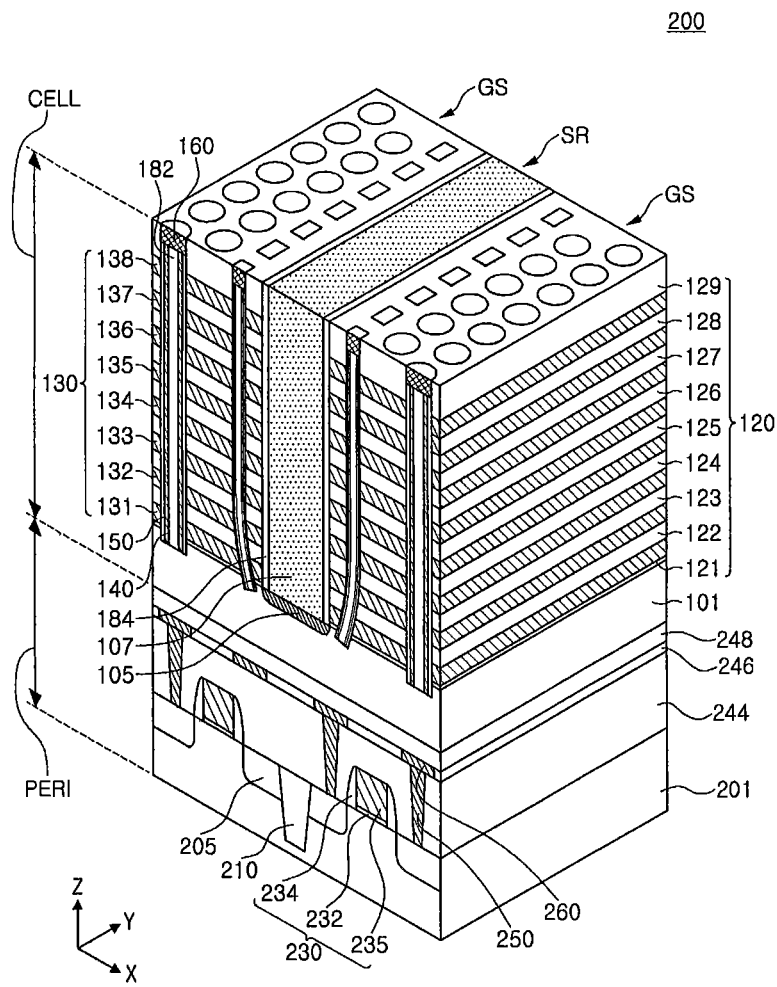
FIG. 21 is a schematic perspective view of a semiconductor device according to another example embodiment of the present inventive concept.

FIG. 21 is a schematic perspective view of a semiconductor device according to another example embodiment of the present inventive concept.

Referring to FIG. 21, a semiconductor device 200 may include a cell region CELL and a peripheral circuit region PERI.

The cell region CELL may correspond to a region in which the memory cell array 20 of FIG. 1 is disposed, and the peripheral circuit region PERI may correspond to a region in which the drive circuit 30 of the memory cell array 20 of FIG. 1 is disposed. The cell region CELL may be disposed at a top end of the peripheral circuit region PERI. In another example embodiment, the cell region CELL may be disposed below the peripheral circuit region PERI.

The cell region CELL may include the substrate 101, the plurality of channel layers 140 disposed to be perpendicular with respect to the upper surface of the substrate 101, and the plurality of interlayer insulating layers 120 and the plurality of gate electrodes 130 stacked along outer sidewalls of the channel layers 140. The cell region CELL may further include the gate dielectric layer 150 disposed between each of the channel layers 140 and the gate electrodes 130, a common source line 107 disposed on the source region 105, and the channel pad 160 disposed on each channel layer 140. The common source line 107 may contain tungsten (W), aluminum (Al) or copper (Cu).

In the example embodiment, although the cell region CELL is illustrated as having the same structure as the example embodiment of FIG. 4 except for the common source line 107, it is not limited thereto. The cell region CELL may include, for example, the semiconductor devices according to various example embodiments of the present inventive concept described with reference to FIGS. 7 to 12.

The peripheral circuit region PERI may include a base substrate 201, circuit elements 230 disposed on the base substrate 201, contact plugs 250, and wiring lines 260.

The base substrate 201 may have an upper surface extended in an x-direction and a y-direction. The base substrate 201 may be provided with a device separating layer 210 to define an active region. In a portion of the active region, a doping region 205 containing an impurity may be disposed. The base substrate 201 may contain a semiconductor material, for example, a group IV semiconductor, a group III-V compound semiconductor, or a group II-VI oxide semiconductor. For example, the group IV semiconductor may contain silicon, germanium, or silicon-germanium. The base substrate 201 may be provided as a bulk wafer or an epitaxial layer.

The circuit elements 230 may include planar transistors. Each of the circuit elements 230 may include a circuit gate insulating layer 232, a spacer layer 234, and a circuit gate electrode 235. The doping region 205 may be disposed in a region of the base substrate 201 at sides of the circuit gate electrodes 235, thereby serving as a source region or a drain region of the circuit element 230.

A plurality of peripheral region insulating layers 244, 246, and 248 may be disposed on the circuit elements 230 on the base substrate 201. The peripheral region insulating layer 244 may have a high density plasma layer to fill a space between the plurality of circuit elements 230.

The contact plugs 250 may penetrate through the peripheral region insulating layer 244 to be connected to the doping region 205. An electrical signal may be applied to the circuit elements 230 by the contact plugs 250. In a region not illustrated in the example embodiment, contact plugs may be connected to the circuit gate electrodes 235. The wiring lines 260 may be connected to the contact plugs 250, and, in an example embodiment, may be disposed in a plurality of layers.

After the peripheral circuit region PERI is manufactured, the substrate 101 of the cell region CELL may then be disposed thereabove, whereby the cell region CELL may be manufactured. The substrate 101 may be formed to have a size identical to or smaller than that of the base substrate 201. The substrate 101 may be formed of polycrystalline silicon. Alternatively, after the substrate 101 is formed of amorphous silicon, it may be single crystallized.

The cell region CELL and the peripheral circuit region PERI may be connected to each other in a region not illustrated in the example embodiment. For example, ends of the gate electrodes 130 in the y-direction may be electrically connected to the circuit elements 230.

In the semiconductor device 200 according to the example embodiment, the cell region CELL and the peripheral circuit region PERI are vertically disposed, such that a device having a reduced size may be implemented.

Figure 22:
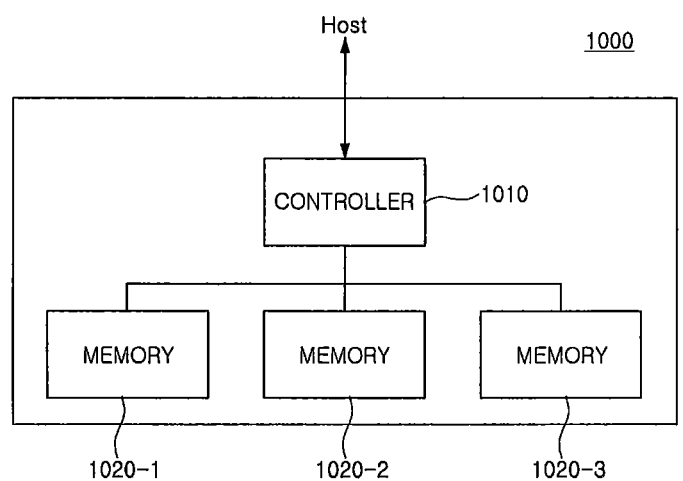
FIG. 22 is a block diagram of a storage apparatus including a semiconductor device according to an example embodiment of the present inventive concept.

FIG. 22 is a block diagram of a storage apparatus including the semiconductor device according to an example embodiment of the present inventive concept.

Referring to FIG. 22, a storage apparatus 1000 according to the example embodiment of the present inventive concept may include a controller 1010 communicating with a Host, and memories 1020-1, 1020-2 and 1020-3 storing data. The respective memories 1020-1, 1020-2 and 1020-3 may include the semiconductor devices according to various embodiments of the present inventive concept described with reference to FIGS. 1 to 21.

Examples of the host communicating with the controller 1010 may include various electronic devices on which the storage apparatus 1000 is mounted. For example, the host may be, for example, a smartphone, a digital camera, a desktop computer, a laptop computer, a portable media player or the like. The controller 1010 may receive a data writing or reading request transferred from the host to store data in the memories 1020-1, 1020-2 and 1020-3 or generate a command for retrieving data from the memories 1020-1, 1020-2 and 1020-3.

As illustrated in FIG. 22, at least one or more memories 1020-1, 1020-2 and 1020-3 may be connected to the controller 1010 in parallel in the storage apparatus 1000. The plurality of memories 1020-1, 1020-2 and 1020-3 may be connected to the controller 1010 in parallel, whereby the storage apparatus 1000 having a high capacity, such as a solid state drive may be implemented.

Figure 23:
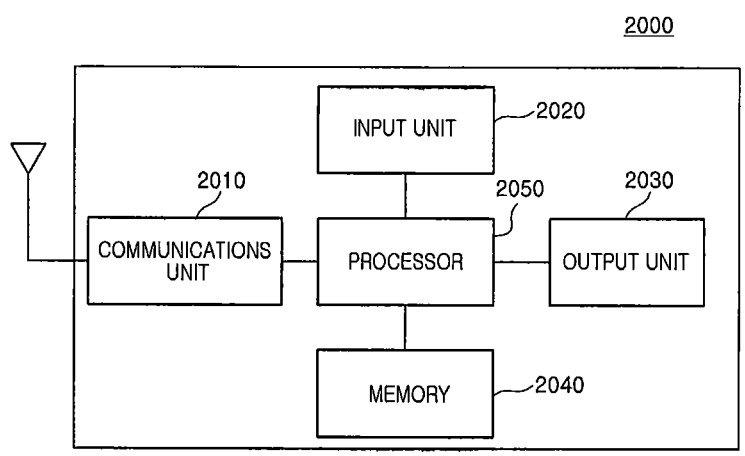
FIG. 23 is a block diagram of an electronic apparatus including a semiconductor device according to an example embodiment of the present inventive concept.

FIG. 23 is a block diagram of an electronic apparatus including the semiconductor device according to an example embodiment of the present inventive concept.

Referring to FIG. 23, an electronic apparatus 2000 according to the example embodiment may include a communications unit 2010, an input unit 2020, an output unit 2030, a memory 2040, and a processor 2050.

The communications unit 2010 may include a wired or wireless communications module, a wireless Internet module, a local area communications module, a global positioning system (GPS) module, a mobile communications module and the like. The wired or wireless communications module included in the communications unit 2010 may be connected to external communications networks according to various communications standard specifications to transmit and receive data.

The input unit 2020 may be a module provided to control an operation of the electronic apparatus 2000 by a user and may include a mechanical switch, a touchscreen, a voice recognition module, and the like. In addition, the input unit 2020 may include a mouse operating in a track ball or a laser pointer scheme or a finger mouse device. In addition to these, the input unit 2020 may further include various sensor modules allowing a user to input data thereto.

The output unit 2030 may output information processed in the electronic apparatus 2000 in a sound or image form, and the memory 2040 may store programs for the processing and the control of the processor 2050. The memory 2040 may include at least one semiconductor device according to various example embodiments of the present inventive concept as described with reference to FIGS. 1 to 21. The processor 2050 may transfer a command to the memory 2040 according to a required operation to thereby store or retrieve data.

The memory 2040 may be embedded in the electronic apparatus 2000 to communicate with the processor 2050 or communicate with the processor 2050 through a separate interface. In a case in which the memory 2040 communicates with the processor 2050 through a separate interface, the processor 2050 may store or retrieve data, through various interface standards, such as SD, SDHC, SDXC, MICRO SD, USB and the like.

The processor 2050 may control operations of respective components included in the electronic apparatus 2000. The processor 2050 may perform control and processing in association with voice communications, video telephony, data communications and the like, or may perform control and processing for multimedia reproduction and management. In addition, the processor 2050 may process an input transferred from a user through the input unit 2020 and may output results thereof through the output unit 2030. In addition, the processor 2050 may store data used in controlling the operation of the electronic apparatus 2000 as described above, in the memory 2040, or fetch data from the memory 2040.

Figure 24:
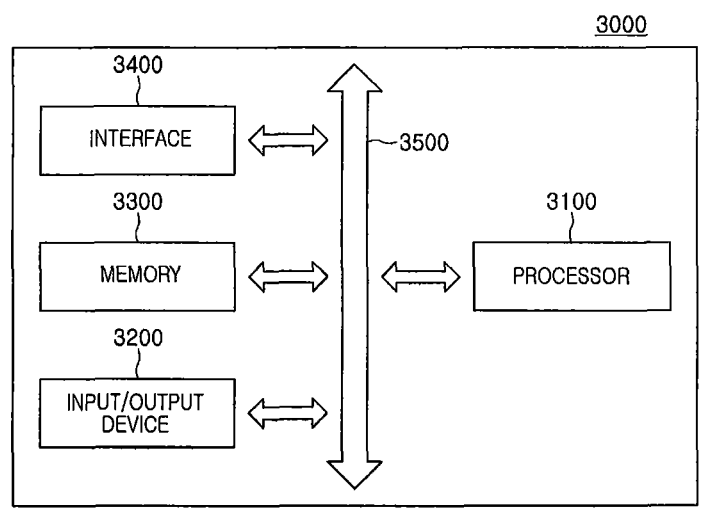
FIG. 24 is a schematic diagram of a system including a semiconductor device according to an example embodiment of the present inventive concept.

FIG. 24 is a schematic diagram of a system including the semiconductor device according to an example embodiment of the present inventive concept.

Referring to FIG. 24, a system 3000 may include a controller 3100, an input/output device 3200, a memory 3300, and an interface 3400. The system 300 may transmit or receive mobile system information. Examples of the mobile system may include PDAs, portable computers, web tablets, wireless phones, mobile phones, digital music players and memory cards.

The controller 3100 may execute a program and control the system 3000. The controller 3100 may be a microprocessor, a digital signal processor, a microcontroller or device similar thereto.

The input/output device 3200 may be used to input or output data to or from the system 3000. The system 3000 may be connected to an external device, for example, a personal computer or network, and may exchange data with the external device. The input/output device 3200 may be a keypad, a keyboard, or a display device.

The memory 3300 may store a code and/or data for operating the controller 3100 and/or store data having been processed by the controller 3100. The memory 3300 may include the semiconductor device according to the example embodiments of the present inventive concept.

The interface 3400 may be a data transmission path between the system 3000 and an external device. The controller 3100, the input/output device 3200, the memory 3300, and the interface 3400 may be in communication with other modules via a bus 3500.

At least one of the controller 3100 or the memory 3300 may include at least one of the semiconductor devices described with reference to FIGS. 1 through 21.

As set forth above, according to example embodiments of the present inventive concept, a semiconductor device having improved reliability by disposing a guide region outwardly of channel regions may be provided.

Various advantages and effects in example embodiments of the present inventive concept are not limited to the above-described descriptions and may be easily understood through explanations of concrete embodiments of the present inventive concept.

While example embodiments have been shown and described above, it will be apparent to those skilled in the art that modifications and variations could be made without departing from the spirit and scope of the present inventive concept as defined by the appended claims.

What is claimed is:

1. A semiconductor device comprising:
    a substrate comprising a source region portion;
    gate stacks disposed on the substrate and spaced apart from each other in a first direction, with a separation region directly contacting the source region portion of the substrate and interposed between the gate stacks, the source region portion of the substrate being disposed between the separation region and regions of the substrate not within the source region portion;
    channel regions penetrating through the gate stacks and disposed within each of the gate stacks; and
    a guide region adjacent to the separation region, penetrating through at least a portion of one of the gate stacks, and having a bent portion that is bent toward the separation region;
    wherein the channel regions are disposed in channel openings that penetrate through the gate stacks,
    the guide region is disposed in a guide opening that penetrates through at least the portion of the one of the gate stacks,
    the separation region is disposed in a separation opening that penetrates through the gate stacks, and
    a width of the separation opening is greater than a width of each of the guide opening and the channel openings,
    wherein the guide opening is closer to the separation region than the channel openings, and an upper portion of the guide opening is spaced apart from an upper portion of the separation region.

2. The semiconductor device of claim 1, wherein the guide region is extended from an upper portion of the one of the gate stacks to the substrate, and the bent portion is positioned in a lower portion of the guide region adjacent to the substrate.

3. The semiconductor device of claim 1, wherein the channel regions are disposed in a plurality of rows within each of the gate stacks, and the guide region is positioned outwardly of the channel regions disposed in the plurality of rows.

4. The semiconductor device of claim 1, wherein the guide region is disposed within each of the gate stacks and is surrounded by the one of the gate stacks.

5. The semiconductor device of claim 1, wherein at least a portion of the guide region is exposed through the separation region.

6. The semiconductor device of claim 5, wherein the bent portion is exposed through the separation region.

7. The semiconductor device of claim 1, wherein a depth of the guide region is shallower than a depth of the channel regions, from an upper surface of the separation region relative to the substrate.

8. The semiconductor device of claim 7, wherein the guide region is not connected to the substrate.

9. The semiconductor device of claim 1, wherein the channel regions and the guide region include channel layers and at least portions of gate dielectric layers and have pillar shapes.

10. The semiconductor device of claim 9, further comprising:
    bit lines electrically connected to the channel layers within the channel regions,
    wherein the channel layer of the guide region is electrically isolated from the bit lines.

11. The semiconductor device of claim 1, wherein the gate stacks include gate electrodes disposed on the substrate and spaced apart from each other in a vertical direction and interlayer insulating layers alternately stacked with the gate electrodes.

12. The semiconductor device of claim 1, wherein the separation opening has a line shape in a plan view.

13. A semiconductor device, comprising:
    a substrate having a source region therein;
    first gate stacks and second gate stacks disposed on the substrate;
    a separation opening between the first gate stacks and the second gate stacks and exposing at least a portion of the source region;
    channel openings penetrating the first and second gate stacks and disposed within each of the first and second gate stacks;
    a guide opening penetrating through at least a portion of one of the first and second gate stacks, and having a bent portion that is bent toward the separation opening;
    a separation region disposed in the separation opening;
    channel regions disposed in the channel openings; and
    a guide region disposed in the guide opening,
    wherein a width of the separation opening is greater than a width of each of the guide opening and the channel openings.

14. The semiconductor device of claim 13, wherein the guide region is disposed on an end portion of the first gate stacks so as to be interposed between the separation region and the first gate stacks.

15. The semiconductor device of claim 13, wherein the channel regions extend into the substrate and the guide region and the bent portion of the guide opening terminates in the first gate stacks so that a portion of the first gate stacks is between the bent portion and the substrate.

16. The semiconductor device of claim 13, wherein the guide opening is closer to the separation region than the channel openings, and an upper portion of the guide opening is spaced apart from an upper portion of the separation region.

* * * * *